US012805375B2

(12) United States Patent
Chew

(10) Patent No.: US 12,805,375 B2
(45) Date of Patent: Nov. 17, 2026

(54) SEMICONDUCTOR PACKAGING METHOD AND THE STRUCTURE FORMED THEREFROM

(71) Applicant: PEP INNOVATION PTE. LTD., Singapore (SG)

(72) Inventor: Hwee Seng Chew, Singapore (SG)

( * ) Notice: Subject to any disclaimer, the term of this patent is extended or adjusted under 35 U.S.C. 154(b) by 391 days.

(21) Appl. No.: 18/422,034

(22) Filed: Jan. 25, 2024

(65) Prior Publication Data

US 2024/0258260 A1 Aug. 1, 2024

(30) Foreign Application Priority Data

Jan. 26, 2023 (SG) ........................... 10202300200R

(51) Int. Cl.

| | |
|---|---|
| ***H10W 74/01*** | (2026.01) |
| ***H10W 70/09*** | (2026.01) |
| ***H10W 70/60*** | (2026.01) |
| ***H10W 74/00*** | (2026.01) |

(52) U.S. Cl.

CPC ......... *H10W 74/019* (2026.01); *H10W 74/00* (2026.01); *H10W 74/014* (2026.01); *H10W 70/09* (2026.01); *H10W 70/60* (2026.01)

(58) Field of Classification Search

CPC . H10W 74/019; H10W 74/00; H10W 74/014; H10W 70/09; H10W 70/60; H10W 70/093; H10W 74/117; H10W 20/40; H10W 72/019; H10W 74/01; H10W 74/137; H10W 74/147; H10W 20/484;

(Continued)

(56) References Cited

U.S. PATENT DOCUMENTS

| | | | | |
|---|---|---|---|---|
| 6,369,455 | B1 | 4/2002 | Ho et al. | |
| 10,068,831 | B2 * | 9/2018 | Costa .................... | H10W 40/22 |
| 12,002,734 | B2 | 6/2024 | Chen et al. | |

(Continued)

FOREIGN PATENT DOCUMENTS

| | | | |
|---|---|---|---|
| CN | 114628256 | A | 6/2022 |
| TW | 452956 | B | 9/2001 |
| TW | 202230652 | A | 8/2022 |

OTHER PUBLICATIONS

The first Office Action of counterpart TW application 113103008, dated Jan. 3, 2025, 18 pages with English translation.

(Continued)

*Primary Examiner* — Allison Bernstein

(57) ABSTRACT

The present application discloses a semiconductor structure including one or more dies, a protective layer formed on a die active surface, pre-vias formed in the protective layer, and a molding layer encapsulating the die(s) and the protective layer. The die has a die back surface exposed from the molding layer, and the molding layer has a molding thickness larger than a die thickness and a thickness of the protective layer combined for forming a cavity contour. The semiconductor structure also includes a conductive layer formed conformally to the cavity contour for forming a concave contour of the conductive layer. The present application also discloses methods of making the semiconductor structure having a sacrificial layer for solving an issue of die cracking during a thinning process such as backgrinding to a reconstituted panel with the dies embedded within the molding layer.

19 Claims, 32 Drawing Sheets

S290

(58) Field of Classification Search
CPC .. H10W 70/05; H10W 70/652; H10W 70/655
See application file for complete search history.

(56) References Cited

U.S. PATENT DOCUMENTS

| | | | | |
|---|---|---|---|---|
| 2020/0105545 | A1* | 4/2020 | Wang | H10P 54/00 |
| 2022/0013462 | A1* | 1/2022 | Chen | H10W 20/081 |
| 2022/0262697 | A1 | 8/2022 | Fang | |

OTHER PUBLICATIONS

The second Office Action of counterpart TW application 113103008, dated Apr. 8, 2025, 24 pages with English translation.
The third Office Action of counterpart TW application 113103008, dated May 23, 2025, 30 pages with English translation.

* cited by examiner

S11

S12

S17

S210

S212

S220

S250

S290

S270

S322

S324

S350

S360

S390

S372

S374

S376

SEMICONDUCTOR PACKAGING METHOD AND THE STRUCTURE FORMED THEREFROM

CROSS-REFERENCE TO RELATED APPLICATIONS

This application claims priority to Singapore Application 10202300200R, filed Jan. 26, 2023 and entitled "Semiconductor Chip (IC) Fan-out Die Back cavity Interconnect Package Structure", which is incorporated herein by reference in its entirety.

TECHNICAL FIELD

The present application is directed to a semiconductor packaging structure, and more particularly a fan-out semiconductor structure having a cavity structure. The present application also pertains to a method of making the semiconductor packaging structure with a sacrificial layer to prevent die crack during a thinning or grinding process, which produces the fan-out semiconductor structure having the cavity structure.

BACKGROUND

Thinning process refers to a semiconductor manufacturing process to reduce a thickness of a semiconductor wafer or a reconstitute panel. The thinning process is usually performed by removing a portion of the semiconductor wafer or the reconstitute panel from its backside using a grinding wheel and is also called backgrinding process.

However, the current backgrinding process faces a risk of die cracking, particularly to the next generation semiconductor materials such as Silicon Carbide (SiC) and Gallium Nitride (GaN) due to their greater hardness and brittleness than Silicon (Si).

Therefore, the present application discloses a method to solve the issue of die cracking during the backgrinding process to the reconstituted panel; and the fan-out semiconductor structure made from the method accordingly.

SUMMARY

As a first aspect, the present application discloses a semiconductor structure. The semiconductor structure includes one or more dies and each die has a die thickness between a die active surface and a die back surface opposed to each other, and the die active surface includes a die pad. The semiconductor structure includes a protective layer formed on the die active surface, and pre-vias are formed in the protective layer for exposing the die pad from the pre-vias. The semiconductor structure includes a molding layer encapsulating the at least one die and the protective layer, and the die back surface is exposed from the molding layer, and the molding layer has a molding thickness larger than the die thickness and a thickness of the protective layer combined for forming a cavity contour. The semiconductor structure includes a conductive layer formed conformally to the cavity contour for forming a concave contour of the conductive layer.

The semiconductor structure may further include filled vias in the protective layer by filling the pre-vias with a conductive medium, and the filled vias are electrically coupled to the die pad. The semiconductor structure may further include a build-up layer formed on the filled vias for being electrically coupled to the die pad. The semiconductor structure may further include a conducting structure coupled to the build-up layer and the conductive layer from the die active surface and the die back surface, respectively. The semiconductor structure may further include a back dielectric layer encapsulating the conductive layer.

The die may further include two or more chips encapsulated within the molding layer for forming a multi-chip module (MCM), and the two or more chips are electrically coupled to the build-up layer. One or more of the two or more chips of the MCM is completely encapsulated within the molding layer.

The semiconductor structure may further include a heat sink disposed on the conductive layer, and the heat sink has a convex contour complementary to the concave contour of the conductive layer.

The semiconductor structure may further include a sacrificial layer formed on the die back surface, and the sacrificial layer has a first surface in contact with the die back surface and a second surface co-planar with a top surface of the molding layer.

As a second aspect, the present application discloses a method of making a semiconductor structure. The method includes a step of providing one or more dies having a die active surface and a die back surface, and the die active surface includes a die pad, and a sacrificial layer is formed on the die back surface. The method includes a step of forming a molding layer for encapsulating the one or more dies and the sacrificial layer; a step of removing a portion of the molding layer for exposing the sacrificial layer from the molding layer; a step of removing the sacrificial layer from the die back surface for forming a cavity contour; and a step of forming a conductive layer conformally to the cavity contour for forming a concave contour of the conductive layer.

The method may further include a step of forming a build-up structure electrically coupled to the die pad; and forming a conducting structure electrically coupled to the build-up structure and the conductive layer from the die active surface and the die back surface, respectively.

The method may further include a step of exposing a side surface of the conducting structure from the molding layer. The method may further include a step of forming a back dielectric layer encapsulating the conductive layer. The method may further include a step of mounting a heat sink on the conductive layer, and the heat sink has a convex contour complementary to the concave contour of the conductive layer.

As a third aspect, the present application discloses another method of making a semiconductor structure. The method involves providing a semiconductor wafer having a wafer active surface and opposed back surface, containing a plurality of unsingulated dies. The method includes steps of applying a sacrificial layer on the wafer back surface, singulating the semiconductor wafer into a plurality of dies with the sacrificial layer on a die back surface of the dies, placing the dies on a carrier with the sacrificial layer faces away from the carrier. The method may also include steps of forming a molding layer for encapsulating the die and the sacrificial layer on the carrier removing a portion of the molding layer for exposing the sacrificial layer from the molding layer, removing the sacrificial layer from the die back surface for forming a cavity contour, and forming a conductive layer conformally to the cavity contour for forming a concave contour of the conductive layer.

The method may further include steps of forming a protective layer on the wafer active surface and forming pre-vias in the protective layer for exposing die pads on the wafer active surface. The method may further include a step of filling the pre-vias with a conductive medium for forming filled vias electrically coupled to the die pads; and forming a build-up layer electrically coupled to the filled vias. The method may further include a step of forming a conducting structure electrically coupled to the build-up layer and the conductive layer from the die active surface and the die back surface, respectively. The method may further include a step of exposing a side surface of the conducting structure from the molding layer. The method may further include a step of forming a back dielectric layer encapsulating the conductive layer. The method may further include a step of mounting a heat sink on the conductive layer, wherein the heat sink has a convex contour complementary to the concave contour of the conductive layer.

BRIEF DESCRIPTION OF THE DRAWINGS

The accompanying figures (Figs.) illustrate embodiments and serve to explain principles of the disclosed embodiments. It is to be understood, however, that these figures are presented for purposes of illustration only, and not for defining limits of relevant applications.

DETAILED DESCRIPTION OF THE INVENTION

Figure 1:
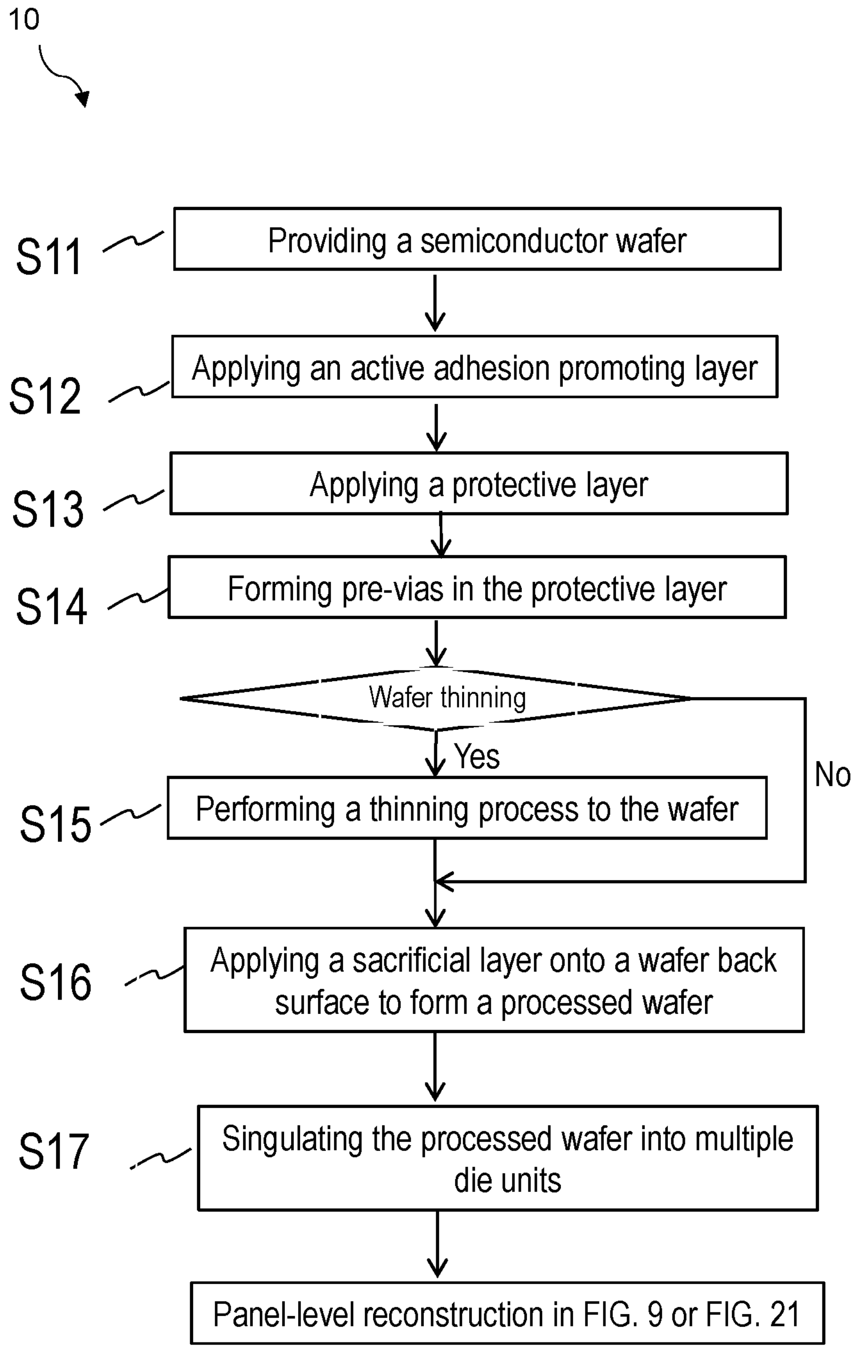
FIG. 1 illustrates a flow chart of a wafer-level semiconductor packaging method 10 according to an exemplary embodiment of the present disclosure.

FIG. 1 illustrates a flow chart of a wafer-level semiconductor packaging method 10 according to an exemplary embodiment of the present disclosure.

Figure 2:
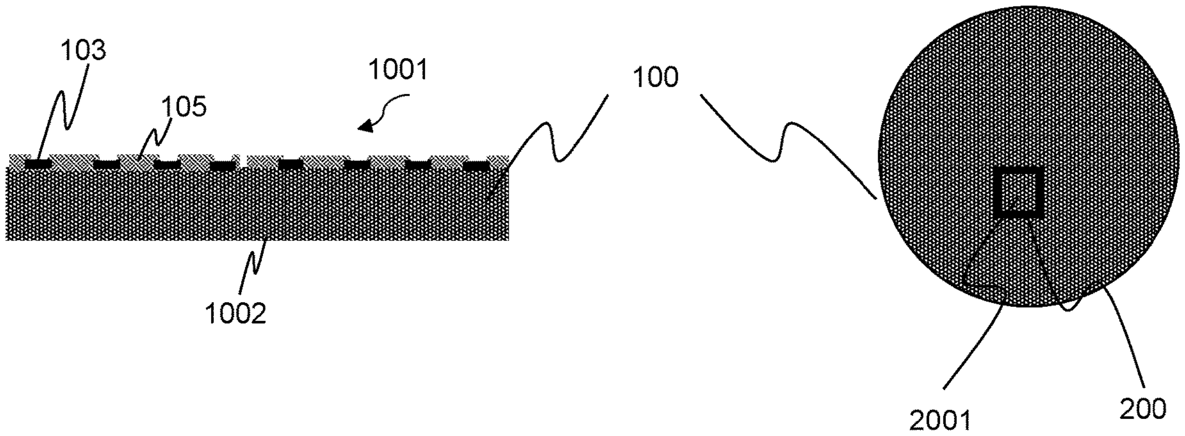
FIGS. 2 to 8B illustrate schematic diagrams of die units with pre-vias or filled vias according to the flow chart in FIG. 1 for various exemplary embodiments of the present disclosure.

Step S11: providing a semiconductor wafer 100. As shown in FIG. 2, the semiconductor wafer 100 has a wafer active surface 1001 and a wafer back surface 1002; and the wafer 100 includes and can be singulated into a plurality of semiconductor dies 200. The semiconductor die 200 has a die active surface 2002 which constitutes the wafer active surface 1001; and the die active surface 2002 before the singulation of the wafer 100 forms active components and passive components by using a series of processes such as doping, deposition and etching, etc. The active components include diodes and triodes, etc., and the passive components include voltage elements, capacitors, resistors and inductors, etc. These active components and passive components are electrically connected to form a functional circuit, so as to implement various functions. The wafer active surface 1001 further includes one or more die pads 103 for leading out the functional circuit and an insulating layer 105 for protecting the die pads 103. The wafer 100 may be made of undoped Silicon (Si), Germanium (Ge), Gallium arsenide (GaAs), Indium phosphide (InP), Silicon Carbide (SiC), Gallium Nitride (GaN) or other semiconductor materials. Accordingly, the insulating layer 105 may constitute the same undoped semiconductor materials as the wafer 100. The die 200 also has a die back surface 2004 opposed to the die active surface 2002. The die back surface 2004 constitutes the wafer back surface 1002. Accordingly, the die 200 has a die thickness between the die active surface 2002 and the die back surface 2004.

Figure 3:
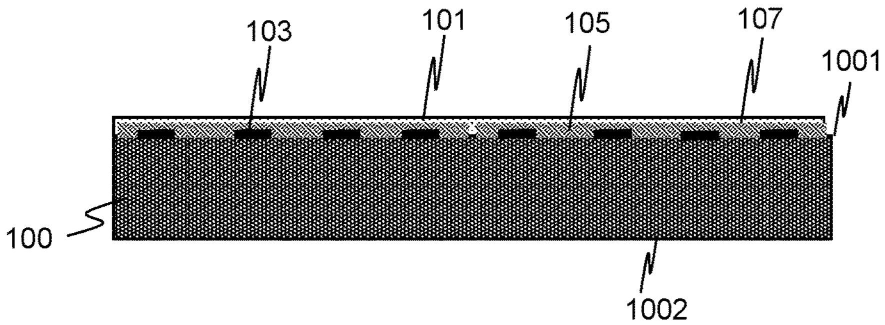

Step S12: optionally applying an active adhesion promoting layer 101 onto the wafer active surface 1001 of the wafer 100. As shown in FIG. 3, the active adhesion promoting layer 101 can be adhered closely on the wafer active surface 1001 during subsequent processes. Meanwhile, the active adhesion promoting layer 101 has a strong binding force with a protective layer 107. Therefore, the active adhesion promoting layer 101 can bind the protective layer 107 to the wafer active surface 1001 more closely. The active adhesion promoting layer 101 may be applied by any suitable methods, such as spin coating, spray coating, slit die coating and screen printing.

In one embodiment, the active adhesion promoting layer 101 may be a plasma-treated layer to the wafer active surface 1001 so as to increase a bonding area and/or a chemically-promoting layer by introducing a chemically-promoting modifier group, such as a surface modifier comprising both a group having affinity with an organic substance and another group having affinity with an inorganic substance between the wafer 100 and the protective layer 107 so as to increase the bonding force between the organic layer and the inorganic layer.

Figure 4:
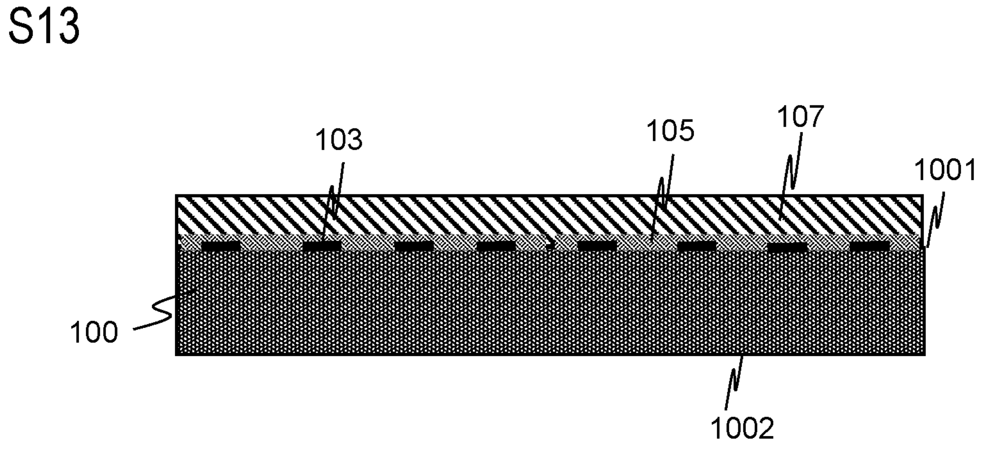

Step S13: applying the protective layer 107 onto the wafer active surface 1001 and optionally the active adhesion promoting layer 101. As shown in FIG. 4, the protective layer 107 protects the die active surface 2002 (shown as the wafer active surface 1001 in FIG. 4 before singulation) in a subsequent molding process at panel-level where a molding pressure may cause a flowing molding material to permeate into a gap between the die 200 and a carrier 220 under a heating condition, which may damage the functional circuit on the die active surface 2002. The protective layer 107 protects the die active surface 2002 by preventing permeation of the molding material, so as to protect the die active surface 2002 in the subsequent molding process.

In a preferred embodiment, the protective layer 107 is an organic/inorganic composite material layer including filler particles embedded within an organic base. For example, the filler particles are inorganic oxide particles, such as $SiO_2$ particles. In one embodiment, the filler particles in the protective layer 107 includes two or more different types of inorganic oxide particles, such as a mixture of $SiO_2$ particles and $TiO_2$ particles. Preferably, the filler particles in the protective layer 107 are spherical or spheroidal. In a preferred embodiment, the filler particles in the protective layer 107 have a fill amount of 50% or more by volume.

In a preferred embodiment, the filler particles in the protective layer 107 have a diameter of less than 3 μm; more preferably, the filler particles in the protective layer 107 have a diameter between 1 μm and 2 μm. Controlling the diameter of the filler particles within the range on one hand facilitates forming pre-vias 109 in the protective layer 107 by a laser patterning process to have a relatively smooth side wall when large particles are excluded for the filler, so that a conductive medium can be effectively filled into the pre-vias 109 to form filled vias 111; and on the other hand exposes the filler particles from the organic base during the laser patterning process, so that side walls 110 of the pre-vias 109 would have a certain roughness with the exposed filler particles. As a result, close contact can be formed between the side walls 110 with the certain roughness and the conductive material so as to form the filled vias 111 with better conductivity.

The conductive medium may be made of Gold, Silver, Copper, Tin, Nickel, Aluminum and the alike, or a combination thereof, or other suitable conductive materials by physical vapor deposition (PVD), chemical vapor deposition (CVD), sputtering, electrolytic electroplating, electrodeless electroplating, or other suitable metal deposition processes to fill the pre-vias 109 with the conductive medium to form the filled vias 111.

The protective layer 107 on one hand has to be thick enough for providing protection to the die active surface 2002; and on the other hand, cannot be too thick for saving material costs and reducing thickness of the resultant semiconductor package. In one embodiment, the protective layer 107 has a thickness in a range of 15 μm to 50 μm; preferably, the protective layer 107 has a thickness in a range of 20 μm to 50 μm. In a further preferred embodiment, the protective layer 107 has a thickness ranging from 35 μm to a thickness of 45 μm.

The protective layer 107 may have a coefficient of thermal expansion (CTE) matching that of the die 200 so that they would maintain a relatively uniform degree of expansion and contraction during respective heating and cooling steps of the subsequent molding process at panel-level so as to mitigate or even avoid an interface stress between the protective layer 107 and the die 200. Therefore, the protective layer 107 and the die 200 are not easily detached or destroyed; and the resultant semiconductor package would become more stable. For this purpose, the protective layer 107 has a coefficient of thermal expansion (CTE) in a range of 3 ppm/K to 10 ppm/K. Preferably, the protective layer 107 has a coefficient of thermal expansion (CTE) in a range of 5 ppm/K to 7 ppm/K.

The protective layer 107 on one hand should have a certain rigidity for supporting the wafer active surface 1001 and on the other hand should have a certain softness for providing buffering effect to resist the molding stress in the subsequent molding process at panel-level. Therefore, the protective layer 107 should have a Young's modulus suitable for both purposes. In one embodiment, the protective layer 107 has a Young's modulus in a range of 1,000 MPa to 20,000 MPa; preferably, the protective layer 107 has a Young's modulus in a range of 1,000 MPa to 10,000 MPa; more preferably, the protective layer 107 has a Young's modulus in a range of 1,000 MPa to 7,000 MPa; and further preferably the protective layer 107 has a Young's modulus in a range of 4,000 MPa to 7,000 MPa; and in a most preferred embodiment, the protective layer 107 has a Young's modulus of around 5,500 MPa. Meanwhile. the protective layer 107 has a tensile strength in a range of 20 MPa to 50 MPa; and preferably in a range of 30 MPa to 40 MPa. In a most preferred embodiment, the protective layer 107 has a tensile strength of around 37 MPa.

Figure 5:
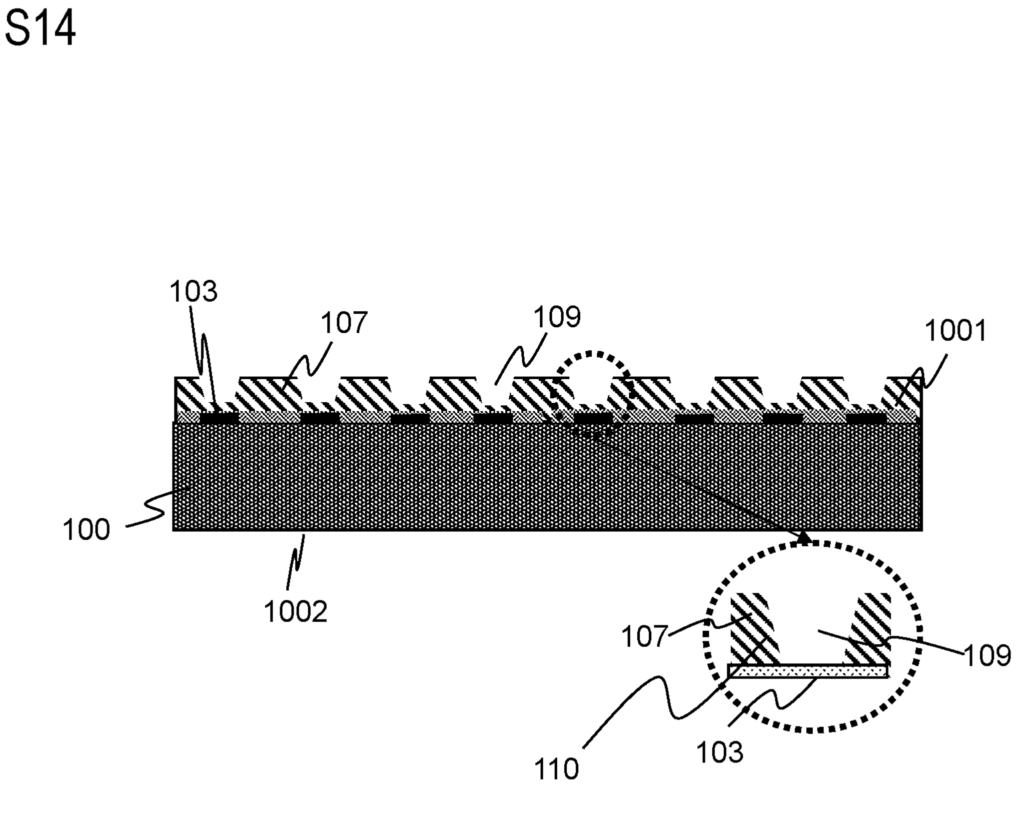

Step S14: forming the pre-vias 109 in the protective layer 107. As shown in FIG. 5, the pre-vias 109 are formed in the protective layer 107 at those positions corresponding to the die pads 103 so as to expose the die pads 103. By forming the pre-vias 109 in the protective layer 107 at wafer-level, the die pads 103 provided on the wafer active surface 1001 can be accurately positioned by the pre-vias 109. In addition, if the pre-vias 109 has a smaller area and a distance between the pre-vias 109 is also smaller, traces formed in a subsequent process can be arranged tighter without worrying about a positional deviation of the die pads 103. The pre-vias 109 may be formed by any suitable methods, such as laser drilling, laser ablation, plasma etching or any combination thereof. In a preferred embodiment, the pre-vias 109 has a V-shaped configuration for facilitating filling of the pre-vias 109 with the conductive medium in a subsequent filling process either at wafer-level or at panel-level.

Figure 6:
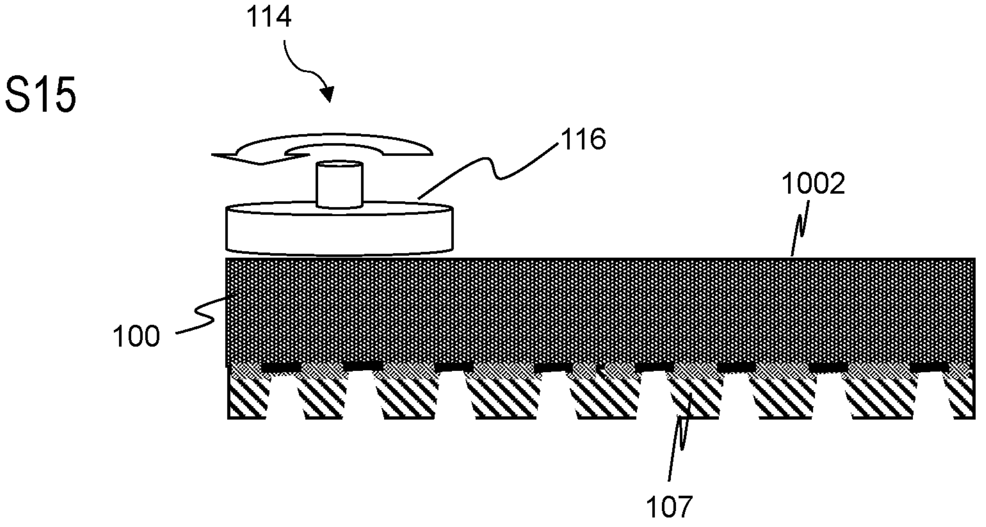

Step S15: optionally performing a thinning process to the wafer 100 from the wafer back surface 1002 in order to reduce thickness of the wafer 100 to a desired dimension. In a preferred embodiment, the thickness of the wafer 100 may be 30 μm or less. As shown in FIG. 6, the thinning process is performed by a backgrinding equipment or grinder 114 with a grinding wheel 116. Alternatively, the thinning process may be performed by a polishing process such as chemical mechanical planarization (CMP). The thinning process is so performed that the wafer back surface 1002 has a substantially flat surface for subsequent processes. The Step S15 may be skipped if the wafer 100 as received has desired thickness and the wafer back surface 1002 has desired flatness; then the thinning process is not necessary in this case.

Figure 7:
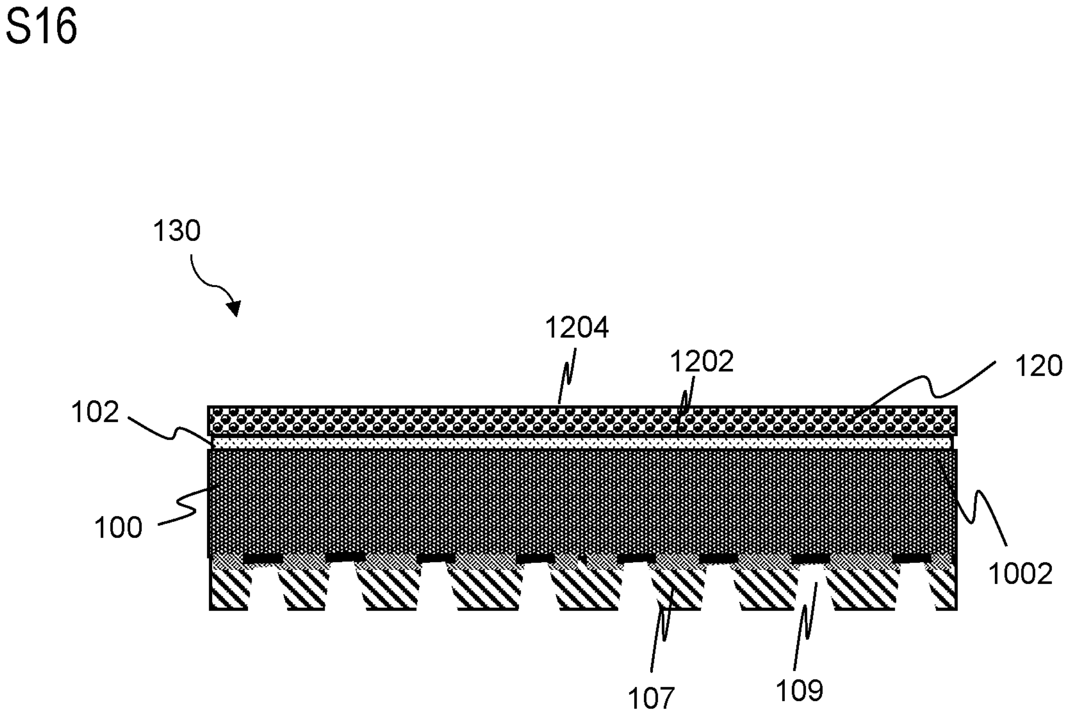

Step S16: Applying a sacrificial layer 120 onto the wafer back surface 1002 to form a processed wafer 130. The sacrificial layer 120 may provide mechanical support to the wafer 100 when the wafer 100 is singulated into the dies 200, especially for wafer 100 with a thin profile either as received or ground in the thinning process in Step S15. As shown in FIG. 7, the sacrificial layer 120 may cover the wafer back surface 1002 completely. Alternatively, the sacrificial layer 120 may only cover certain areas of the wafer back surface 1002 where the dies 200 would be singulated from the wafer 100 for forming a reconstituted panel at panel-level. The sacrificial layer 120 has a first surface 1202 and a second surface 1204 opposed to each other; and the first surface 1202 has a close contact with the wafer back surface 1002 so that the sacrificial layer 120 is not removed unintentionally and accidentally during subsequent processes before being intentionally removed.

The sacrificial layer 120 also provides protection to the die 200 from the die back surface 2004 in a later thinning process to the reconstituted panel with the die 200 embedded therein. Therefore, the sacrificial layer 120 should be thick enough for providing the protection; but meanwhile should not be too thick to increase material costs. The sacrificial layer 120 may have a thickness in a range of 5 to 30 μm, preferably 10 to 30 μm, and more preferably 10 to 20 μm. The thickness of the sacrificial layer 120 may also be determined by multiple factors, including its material properties, thickness of the die 200 and parameters of the later thinning process to the reconstituted panel at panel-level. For example, when considering the thickness of the die 200, a thickness ratio of the die 200 to the sacrificial layer 120 may be in a range of 1.5 to 30, preferably in a range of 3 to 30, or more preferably in a range of 15 to 30, or most preferably around 20.

The sacrificial layer 120 may be made of any materials that can protect the die back surface 2004. The sacrificial layer 120 may include inorganic materials, organic materials, polymers (either thermosetting or thermoplastic) or a combination thereof, such as Ajinomoto Build up Film (ABF), polyimide, epoxy resins and waxes malleable at ambient temperatures (such as higher alkenes and lipids). In a preferred embodiment, the sacrificial layer 120 is made of a polymer base with fillers, where the fillers may be organic fillers (such as spherical particles made of the polymer base) and inorganic fillers (such as silica or silicon dioxide ($SiO_2$) and aluminum oxide ($\alpha$-$Al_2O_3$)). In another preferred embodiment, the sacrificial layer 120 adopts a same material as the protective layer 107. The sacrificial layer 120 may be applied by any suitable methods depending on its material nature, such as compression molding for granule or liquid; vacuum lamination or roller lamination for sheet or film; and screen printing, spin-coating, spray-coating or slit die coating for liquid.

The sacrificial layer 120 on one hand should have a certain rigidity for supporting the wafer back surface 1002 and on the other hand should have a certain softness for providing buffering effect in the subsequent molding process and being suitable for grinding or polishing in the subsequent thinning process. Therefore, the sacrificial layer 120 should have a Young's modulus suitable for both purposes. In one embodiment, the sacrificial layer 120 has a Young's modulus in a range of 1,000 MPa to 20,000 MPa; preferably, the sacrificial layer 120 has a Young's modulus in a range of 1,000 MPa to 10,000 MPa; more preferably, the sacrificial layer 120 has a Young's modulus in a range of 1,000 MPa to 7,000 MPa; and further preferably in a range of 4,000 MPa to 7,000 MPa; and in a most preferred embodiment, the sacrificial layer 120 has a Young's modulus of 5,500 MPa. Meanwhile, the sacrificial layer 120 has a tensile strength in a range of 20 MPa to 50 MPa; and preferably in a range of 30 MPa to 40 MPa. In a most preferred embodiment, the sacrificial layer 120 has a tensile strength of around 37 MPa. Meanwhile, the sacrificial layer 120 has a tensile strength in a range of 20 MPa to 50 MPa; and preferably in a range of 30 MPa to 40 MPa. In a most preferred embodiment, the protective layer 107 has a tensile strength of around 37 MPa. In another most preferable embodiment, the sacrificial layer 120 has a same tensile strength as the protective layer 107 for maintaining stability of a die unit 210 having the die 200 with the protective layer 107 and the sacrificial layer 120 after singulation. before the sacrificial layer 120 is intentionally removed.

The sacrificial layer 120 may have a coefficient of thermal expansion (CTE) matching that of the die 200 so that they would maintain a relatively uniform degree of expansion and contraction during respective heating and cooling steps of the molding process at panel-level, so as to mitigate or even avoid an interface stress between the sacrificial layer 120 and the die 200. Therefore, the sacrificial layer 120 and the die 200 are not easily detached or destroyed before the sacrificial layer 120 is intentionally removed from the die back surface 2004. For this purpose, the sacrificial layer 120 has a coefficient of thermal expansion (CTE) in a range of 3 ppm/K to 10 ppm/K. Preferably, the sacrificial layer 120 has a coefficient of thermal expansion (CTE) in a range of 5 ppm/K to 7 ppm/K. In a more preferable embodiment, the die 200, the protective layer 107 and the sacrificial layer 120 have a substantially same coefficient of thermal expansion (CTE) so that the die unit 210 is prevented from being destroyed from either the die active surface 2002 or the die back surface 2004 during the panel-level semiconductor packaging methods 20, 30.

Optionally, applying a back adhesion promoting layer 102 onto the wafer back surface 1002 of the wafer 100. As shown in FIG. 7, the back adhesion promoting layer 102 can be adhered closely on the wafer back surface 1002 until being intentionally removed together with the sacrificial layer 120. Meanwhile, the back adhesion promoting layer 102 has a strong binding force with the sacrificial layer 120. Therefore, the back adhesion promoting layer 102 can bind the sacrificial layer 120 to the wafer back surface 1002 more closely. The back adhesion promoting layer 102 may be applied by any suitable methods, such as spin coating, spray coating, slit die coating and screen printing.

In one embodiment, the back adhesion promoting layer 102 may be a plasma-treated layer to the wafer back surface 1002 so as to increase a bonding area and/or a chemically-promoting layer by introducing a chemically-promoting modifier group, such as a surface modifier comprising both a group having affinity with an organic substance and another group having affinity with an inorganic substance between the wafer 100 and the sacrificial layer 120 so as to increase the bonding force between the organic layer and the inorganic layer. In a preferred embodiment, the protective layer 107 and the sacrificial layer 120 are made of a same material such as ABF; and accordingly, a same process can be applied to form the protective layer 107 and the sacrificial layer 120 to the wafer active surface 1001 and the wafer back surface 1002, respectively. It is understood that Step S16 of applying the sacrificial layer 120 to the wafer back surface 1002 may be conducted first before Step S13 of applying the protective layer 107 to the wafer active surface 1001, or vise verse.

Figure 8A:
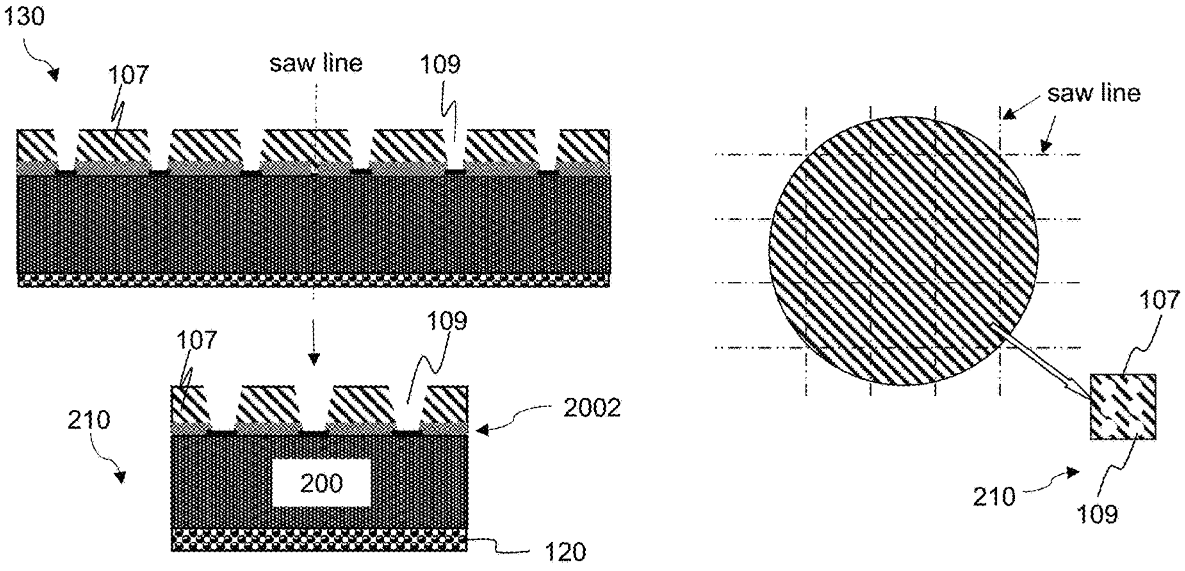
Figure 8B:
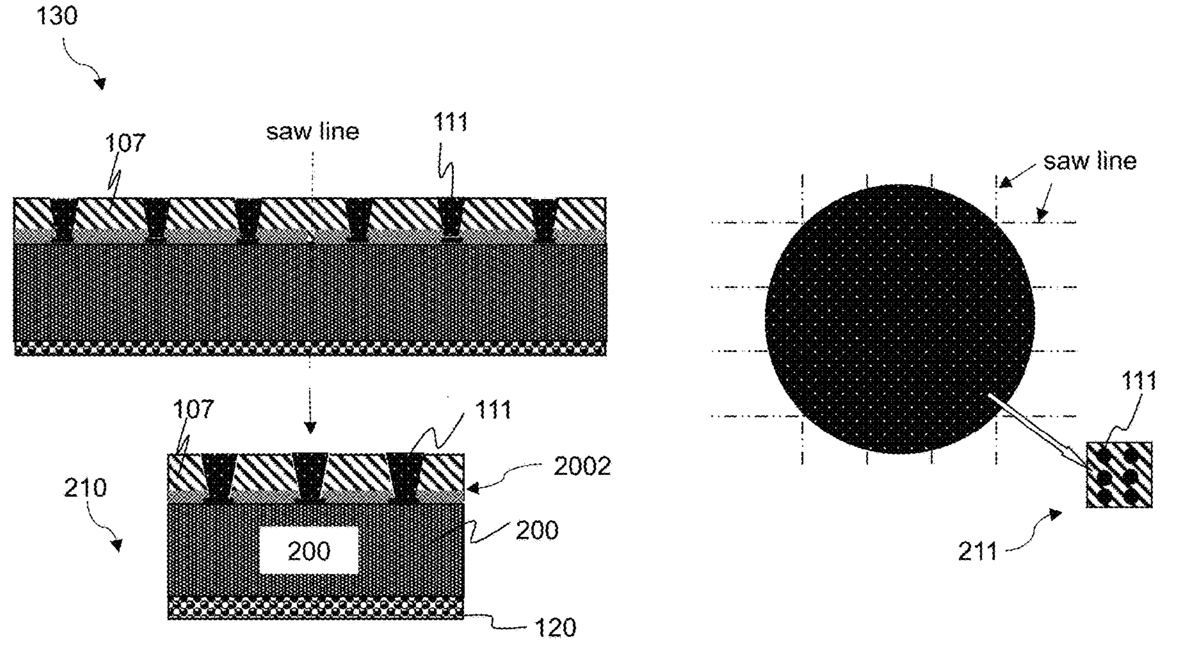

Step S17: Singulating the processed wafer 130 into multiple die units 210 with the protective layer 107 and the sacrificial layer 120 on the die active surface 2002 and the die back surface 2004, respectively. As shown in FIG. 8A and FIG. 8B, the protective layer 107 on the wafer active surface 1001 and the sacrificial layer 120 on the wafer back surface 1002 are retained respectively at the die active surface 2002 and the die back surface 2004 of the die 200 after the processed wafer 130 is cut along saw lines for producing the individual die unit 210. In FIG. 8A the pre-vias 109 of the die unit 210 are unfilled; and the filled vias 111 would be formed at panel-level to the die unit 210 subsequently. Alternatively, in FIG. 8B the pre-vias 109 are filled of the processed wafer 130 before the singulation. The former shown in FIG. 8A is preferred for higher efficiency of filling the pre-vias 109 at the panel-level which has a larger scale than the wafer-level shown in FIG. 8B.

Step S17 may be conducted on either the wafer active surface 1001 or the wafer back surface 1002; and no burrs, crackings or chippings are observed during the singulation, due to the material properties of the protective layer 107 on the wafer active surface 1001 or the material properties of the sacrificial layer 120 on the wafer back surface 1002. In a preferred embodiment, the protective layer 107 or the sacrificial layer 120 may be transparent or semi-transparent so that the saw lines marked on the wafer active surface 1001 or the wafer back surface 1002 can be seen through the protective layer 107 or the sacrificial layer 120; and the singulation is performed accordingly. In a more preferred embodiment, the singulation is performed on the wafer active surface 1001 since the saw lines can be more precisely determined by the pre-vias 109 or the filled vias 111 in the protective layer 107.

Figure 9:
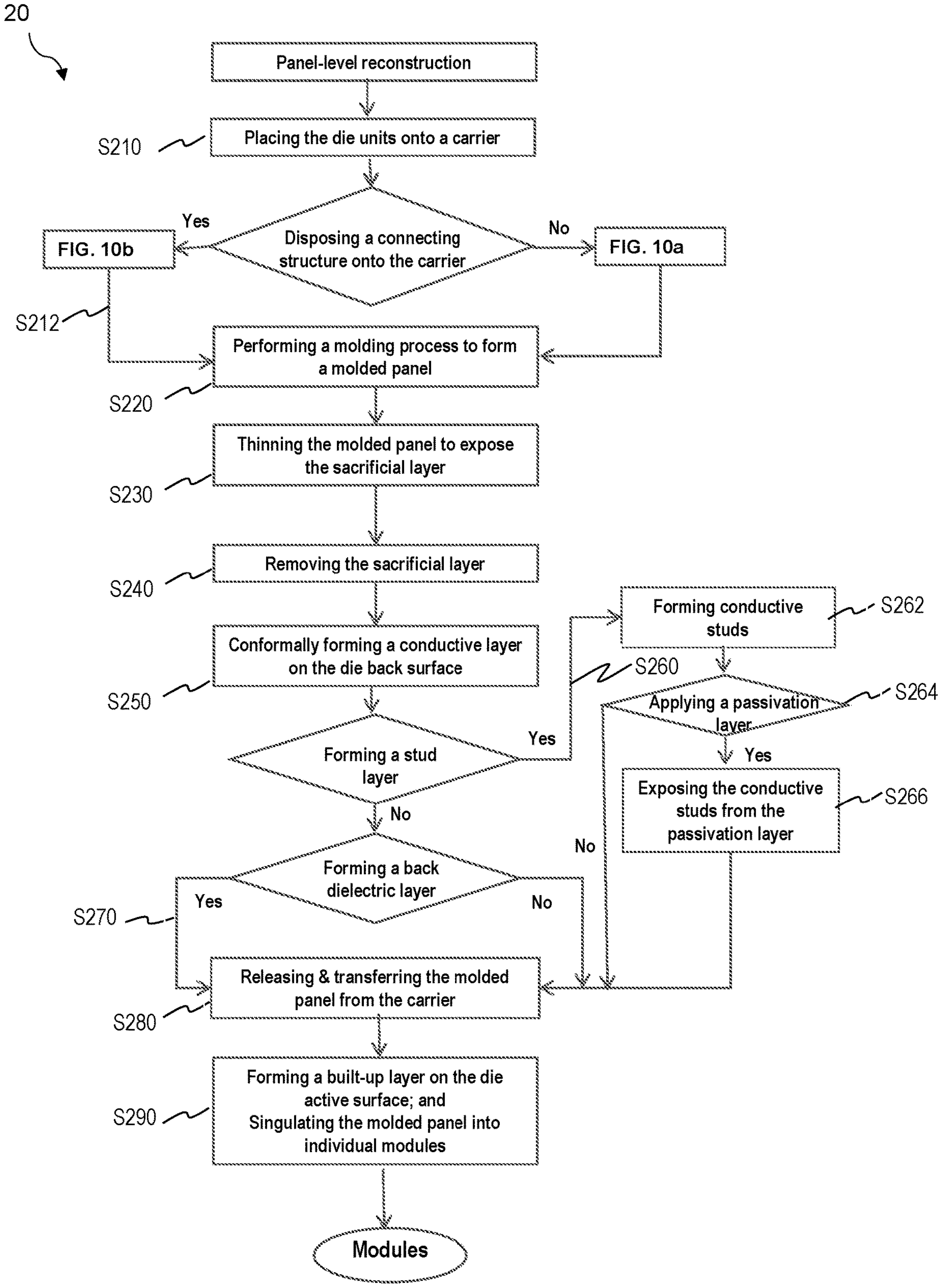
FIG. 9 illustrates a flow chart of a panel-level semiconductor packaging method 20 following the wafer-level semiconductor packaging method 10 in FIG. 1 according to an exemplary embodiment of the present disclosure.

FIG. 9 illustrates a flow chart of a panel-level semiconductor packaging method 20 following the wafer-level semiconductor packaging method 10 shown in FIG. 1, as an exemplary embodiment of the present disclosure.

Figure 10A:
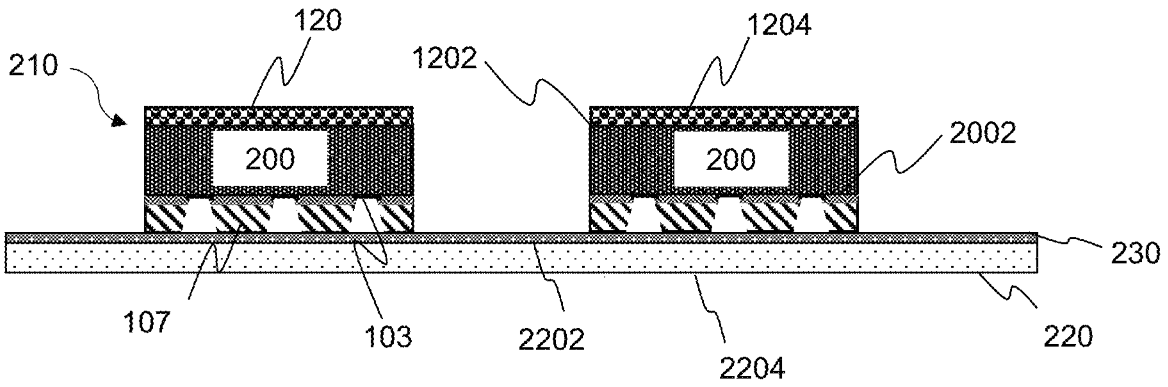
FIGS. 10A to 20M illustrate schematic diagrams of single-chip modules and multi-chip modules according to the flow chart in FIG. 9 for various exemplary embodiments of the present disclosure.

Step S210: placing the die units 210 onto the carrier 220. The die unit 210 may have the pre-vias 109 unfilled or filled as the filled vias 111. The following figures show subsequent processes for the panel-level semiconductor packaging method 20 to the former (i.e., the die unit 210 with the unfilled pre-vias 109 after the wafer-level semiconductor packaging method 10) only; but it is understood that descriptions of the subsequent processes are also generally applicable to the latter (i.e., the die unit 210 with filled vias 111 after the wafer-level semiconductor packaging method 10). As shown in FIG. 10A, the carrier 220 has a carrier front surface 2202 and a carrier back surface 2204 opposed to each other; and markings or fiducials are made on the carrier front surface 2202 for precisely aligning the die units 210 to their respective pre-determined positions on the carrier 220. The carrier 220 may have any size (such as a smaller wafer size or a larger panel size) and any shape (such as a round shape, a rectangular shape or an irregular shape). The carrier 220 may be made of any materials, such as metals (e.g. stainless steel), plastics, resins, glass or a composite thereof as long as it is suitable for carrying the die unit 210 during subsequent processes.

In one embodiment, the die units 210 are respectively placed at their predetermined positions as dictated by the markings or fiducials formed on the carrier front surface 2202. In a preferred embodiment, the placement is made in a face-down manner, i.e., the die active surface 2002 faces to the carrier 220, and the die back surface 2004 faces away from the carrier 220. Optionally, an adhesive layer 230 is applied to the carrier front surface 2202 before placing the die unit 210 in order to hold the die unit 210 on the carrier 220 at their respective positions without movement during subsequent processes. The adhesive layer 230 may be formed by any suitable method, such as lamination, printing, spraying or coating. In a preferred embodiment, the adhesive layer 230 is a heat-and-release tape which can be easily detached from the die unit 210 intentionally by heating. The adhesive layer 230 may be transparent or semi-transparent to a vision apparatus for determining the markings or fiducials on the carrier front surface 2202.

In a conventional method, the die 200 without the sacrificial layer 120 on the die back surface 2004 is transferred to the carrier 220 with a die bonder machine which has a pin to jack up the die 200 from the singulated wafer 100. In order to place the die 200 in the face-down manner to the carrier 220, the pin jacks up the die 200 from the wafer back surface 1002 so that a pressure is applied to the die 200 at the die back surface 2004. The pressure may break the die 200 especially when the die 200 has a thin profile and is made of the brittle semiconductor materials such as Silicon Carbide (SiC) and Gallium Nitride (GaN). However, in the present disclosure, the die unit 210 can be safely transferred to the carrier 220 with the die bonder machine since the sacrificial layer 120 applied on the wafer back surface 1002 (and accordingly on the die back surface 2004 after singulation) can effectively protect the die unit 210 by absorbing the pressure when the pin jacks up the die unit 210.

Step S212: optionally disposing a conducting structure 240 onto the carrier 220. The conducting structures 240 are disposed on the adhesive layer 230 and around the die unit 210; and a bottom surface 2404 of the conducting structure 240 is substantially flush or co-planar with a second surface 1074 of the protective layer 107. The conducting structure 240 has a top surface 2402 opposed to the bottom surface 2404. The conducting structure 240 should have a height more than a total thickness of the die 200 and the protective layer 107 combined, so that the top surface 2402 is above the die back surface 2004. In some embodiments, the conducting structure 240 may have a height more than a thickness of the die unit 210, i.e., a total thickness of the die 200, the protective layer 107 and the sacrificial layer 120 combined.

Figure 10B:
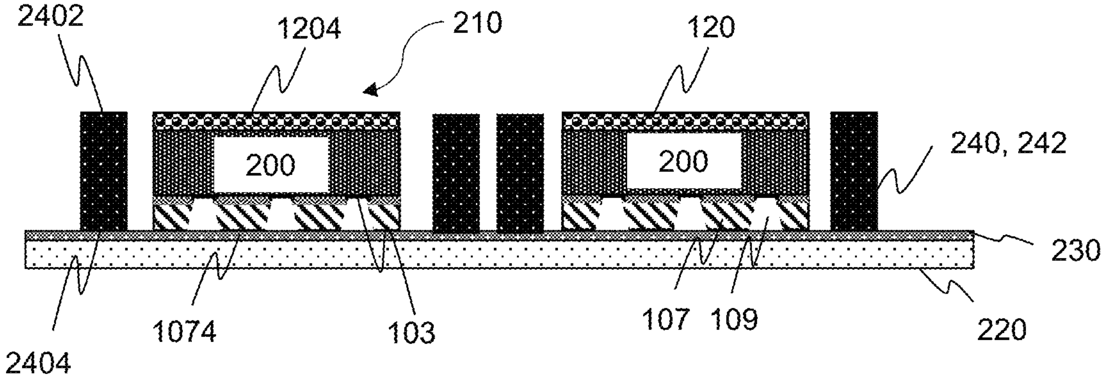

In some embodiments as shown in FIG. 10B, Copper columns 242 are used as the conducting structure 240. In other embodiments, the conducting structure 240 may be in the form of lead frame, molded interconnect substrate (MIS) or any other conductive substrate, printed circuit board (PCB) or anything suitable to be disposed for electrical connection between the die active surface 2002 and the die back surface 2004. Preferably as shown in FIG. 10B, the height of the Copper columns 242 as the conducting structure 240 is substantially the same as the thickness of the die unit 210, i.e., a total thickness of the die 200, the protective layer 107 and the sacrificial layer 120 combined. Accordingly, the top surface 2402 of the conducting structure 240 is flush or co-planar with the second surface 1204 of the sacrificial layer 120.

Step S220: performing a molding process to form a molded panel 250. The molding process may be performed by any suitable methods depending on material properties of molding compounds. In one embodiment, the molding process is performed by compression molding when the molding compounds are in the form of granule or liquid. In another embodiment, the molding process is performed by lamination molding such as vacuum lamination or roller lamination followed by a press and cure process when the molding compounds are in the form of sheet or film. In another embodiment, the molding process is performed by spin coating or slit die coating when the molding compounds are in the form of liquid. A molding layer 260 can be made of any suitable materials for the molding process, such as an organic/inorganic composite material by compression molding. The molding layer 260 may have a coefficient of thermal expansion (CTE) in a range of 3 ppm/K to 10 ppm/K. Preferably, the molding layer 260 has a substantially same or similar coefficient of thermal expansion (CTE) as the protective layer 107 for mitigating or even eliminating an internal stress generated between the protective layer 107 and the molding layer 260 during cycles of expansion and contraction in the molding process. Similarly, the molding layer 260 has a substantially same or similar coefficient of thermal expansion (CTE) as the sacrificial layer 120 for mitigating or even eliminating another internal stress generated between the sacrificial layer 120 and the molding layer 260 during cycles of expansion and contraction in the molding process.

Figure 11A:
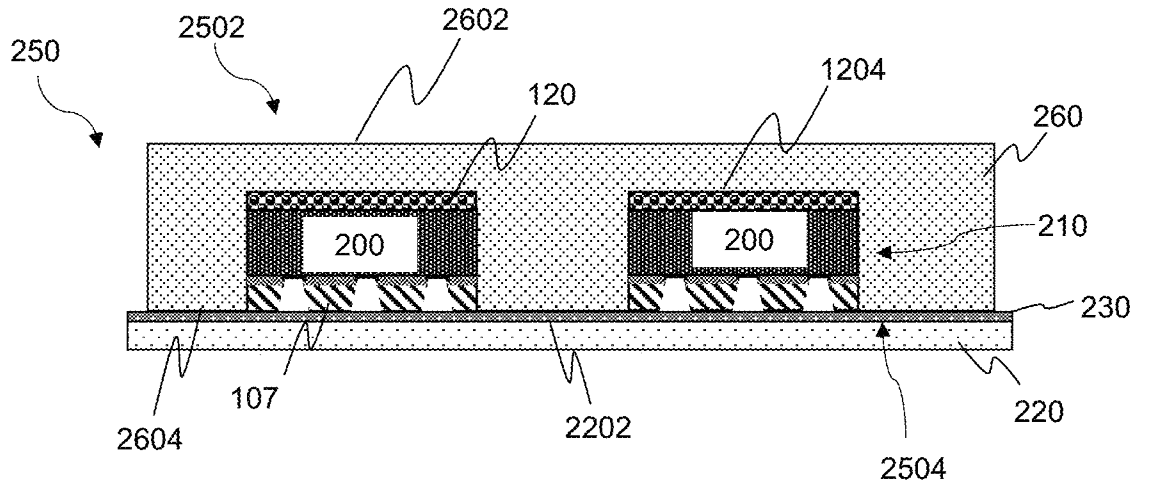

As shown in FIG. 11A, the molding layer 260 is formed to encapsulate all exposed surfaces of the die unit 210 shown in FIG. 10A, and at least a portion of the adhesive layer 230 around but not covered by the die unit 210. Accordingly, the molding layer 260 has atop surface 2602 above the second surface 1204 of the sacrificial layer 120. The molding layer 260 also has a bottom surface 2604 in contact with the adhesive layer 230; and accordingly, the bottom surface 2604 is flush or co-planar with the second surface 1074 of the protective layer 107. Accordingly, the molding layer 260 has a molding thickness between the top surface 2602 and the bottom surface 2604.

It is known that a molding pressure is applied to the die 200 from the die back surface 2004 during the molding process. If without the protective layer 107, the molding pressure may cause the die 200 to sink into the adhesive layer 230 and cause contamination to the die active surface 2002 with residues of the adhesive layer 230 after detaching the adhesive layer 230 from the molded panel 250. Moreover, since the die 200 protrudes under the molding pressure beyond the bottom surface 2604 of the molding layer 260, a stepped structure would be formed between the die active surface 2002 and the bottom surface 2604, which would cause hindrances to subsequent processes on a bottom surface 2504 of the molded panel 250 and finally make the semiconductor packaged unstable.

In the present disclosure, the protective layer 107 can act as a buffer for mitigating or even eliminating the molding pressure in the molding process. As a result, the stepped structure is avoided; and the molded panel 250 has a flat configuration along the bottom surface 2504, particularly between the bottom surface 2604 of the molding layer 260 and the second surface 1074 of the protective layer 107. Similarly, the sacrificial layer 120 may also act as a buffer for further eliminating the molding pressure applied to the die back surface 2004. Therefore, a cumulative effect to avoid forming the stepped structure is achieved by applying both the protective layer 107 and the sacrificial layer 120 on the die active surface 2002 and the die back surface 2004 of the die 200 respectively.

Figure 11B:
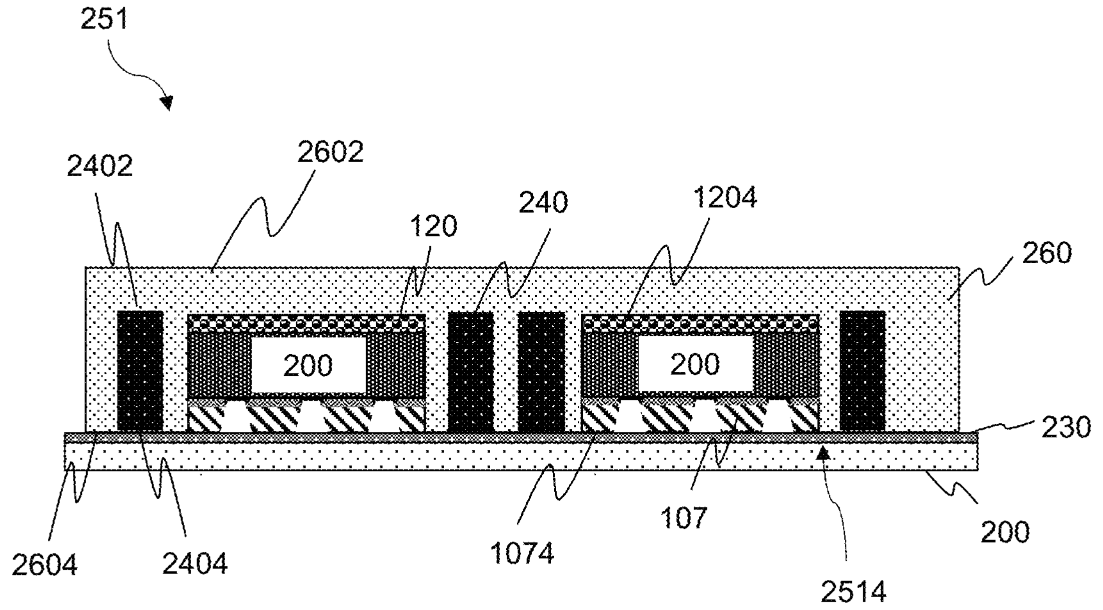

Step S220 can also be similarly performed following FIG. 10B. Accordingly, the molding layer 260 is formed to encapsulate all exposed surfaces of the die unit 210 and of the conducting structure 240, to form a molded panel 251. The molded panel 251 is similar to the molded panel 250 except that the molded panel 251 include the conducting structure 240. As shown in FIG. 11B, the top surface 2602 of the molding layer 260 is above the top surface 2402 of the conducting structure 240 and the second surface 1204 of the sacrificial layer 120. As described above, the protective layer 107 and the sacrificial layer 120 act as the buffers in the molding process. Meanwhile, although neither of the protective layer 107 nor the sacrificial layer 120 is applied to the conducting structure 240, the buffering effect to the die unit 210 still helps mitigate or even eliminate the molding pressure applied to the conducting structure 240 in the molding process, maybe due to its close position to the die unit 210. In addition, the molding pressure applied to the conducting structure 240 is also considerably less than that applied to the die 200, since the top surface 2402 has a smaller area than the die back surface 2004. Therefore, the conducting structure 240 also does not sink into the adhesive layer 230; and accordingly, a bottom surface 2514 of the molded panel 251 has a flat configuration when removed from the adhesive layer 230 and the carrier 220, i.e., the bottom surface 2404 of the conducting structure 240, the second surface 1074 of the protective layer 107 and the bottom surface 2604 of the molding layer 260 are flush or co-planar at a same plane.

Figure 12A:
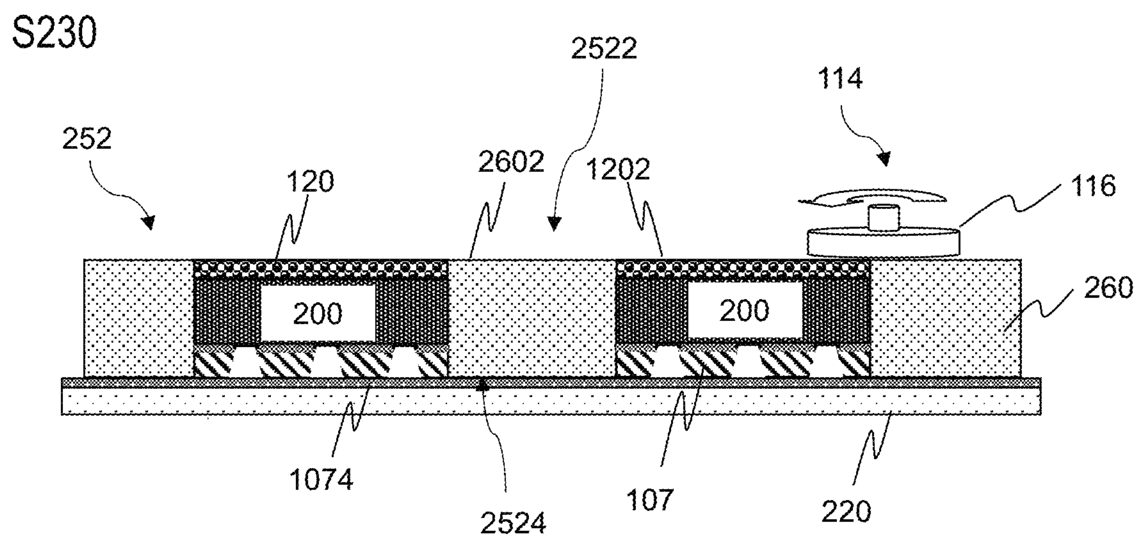
Figure 12B:
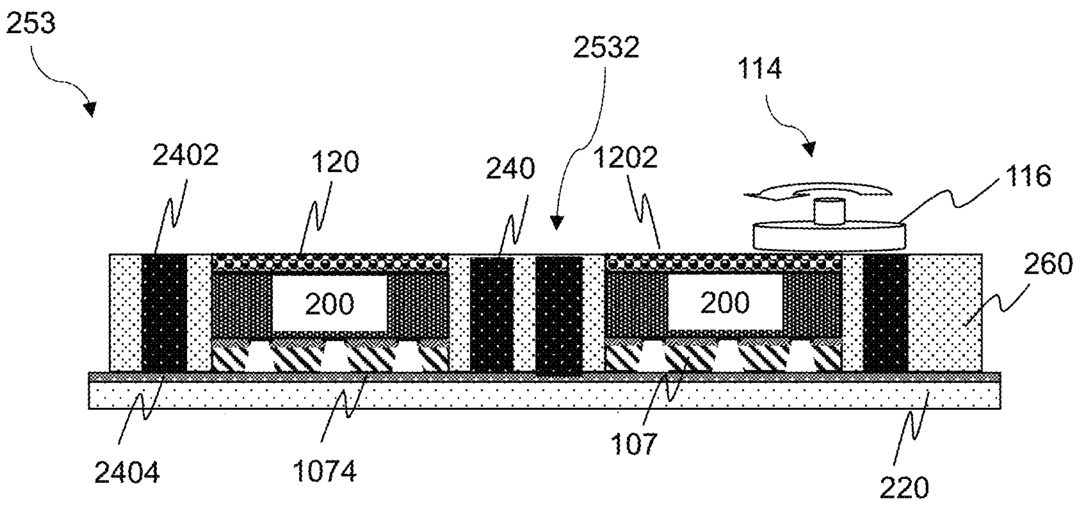

Step S230: thinning the molded panel 250, 251 to expose the sacrificial layer 120 and optionally the conducting structure 240 from the top surface 2602 of the molding layer 260; and a molded panel 252, 253 is thus formed. The thinning process may be conducted by any suitable method of removing a portion of the molding layer 260 from the top surface 2602, such as grinding, polishing and chemical mechanical planarization (CMP). The backgrinding equipment or grinder 114 with a grinding wheel 116 is shown for an example. The thinning process to the molded panel 250, 251 (without/with the conducting structure 240 in FIG. 11A/FIG. 11B) is shown in FIG. 12A/FIG. 12B, respectively to form the molded panel 252, 253. Accordingly, a top surface 2522 of the molded panel 252 has a flat configuration, i.e., the top surface 2602 of the molding layer 260 and the second surface 1204 of the sacrificial layer 120 are flush or co-planar at a same plane as shown in FIG. 12A; while in FIG. 12B, a top surface 2532 of the molded panel 253 has a flat configuration, i.e., the top surface 2402 of the conducting structure 240 is also flush or co-planar with the top surface 2602 and the second surface 1204 at a same plane.

It is shown that the thinning process is not performed directly onto the die back surface 2004 as the die 200 is covered underneath the sacrificial layer 120. Therefore, the present disclosure solves the risk of die cracking with the current backgrinding process by avoiding a direct contact of the grinding apparatus or grinder 114 to the die back surface 2004, particularly if the die 200 is made of the next generation semiconductor materials such as Silicon Carbide (SiC) and Gallium Nitride (GaN) which has greater hardness and brittleness than Silicon (Si). Meanwhile, the grinding apparatus or grinder 114 is also protected from being damaged and can endure for a longer time so as to achieve higher production efficiency.

Figure 13A:
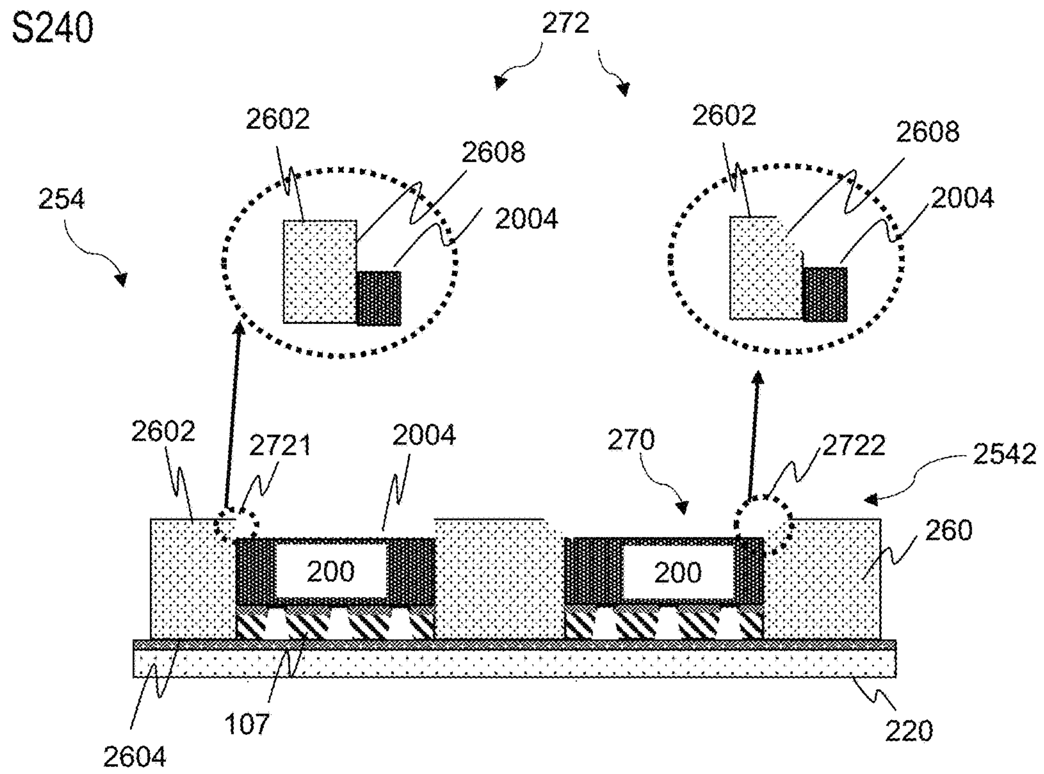

Step S240: removing the sacrificial layer 120 from the die unit 210 to expose the die back surface 2004; and a molded panel 254, 255 is formed. The sacrificial layer 120 may be removed by any suitable methods depending on its material nature, such as chemical etching, plasma etching, acid rinsing, UV laser and mechanical abrasion. In a preferred embodiment, a combination of the suitable methods may be performed for completely removing the sacrificial layer 120. For example, if made of Ajinomoto Build up Film (ABF), the sacrificial layer 120 is firstly destroyed by UV laser and then completely removed by plasma etching with a mixture gas of tetrafluoromethane ($CF_4$) and Oxygen (02). As shown in FIG. 13A/FIG. 13B, the die back surface 2004 is exposed from the molding layer 260; and a cavity contour 270 is formed at the top surface 2542, 2552 of the molded panel 254, 255, i.e., along the top surface 2602 of the molding layer 260, the die back surface 2004 and an interface 272 therebetween.

Figure 13B:
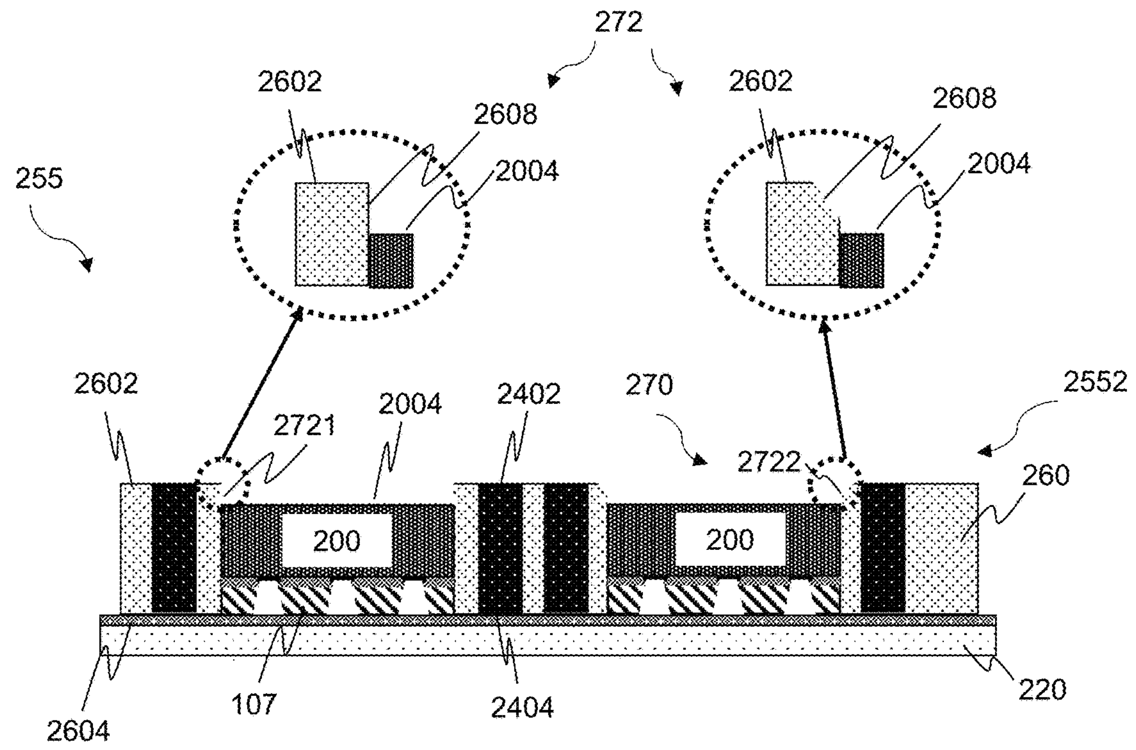

As shown in FIG. 13A/FIG. 13B, the interface 272 is an exposed portion of the sidewall of the molding layer 260 due to the removal of the sacrificial layer 120. In one embodiment, the interface 272 has a vertical profile 2721 along an internal sidewall 2608 of the molding layer 260 while the encapsulation layer 120 is kept almost completely intact. In another embodiment, the interface 272 has a sloped profile 2722 where a portion of the molding layer 260 at an intersection between the top surface 2602 and the internal sidewall 2608 is also removed. The following processes are shown only for the former with the sharp profile 2721 of the interface 272 for simplicity of illustration; but it is understood that the following processes are also applicable to the latter with the sloped profile 2722 of the interface 272.

Figure 14A:
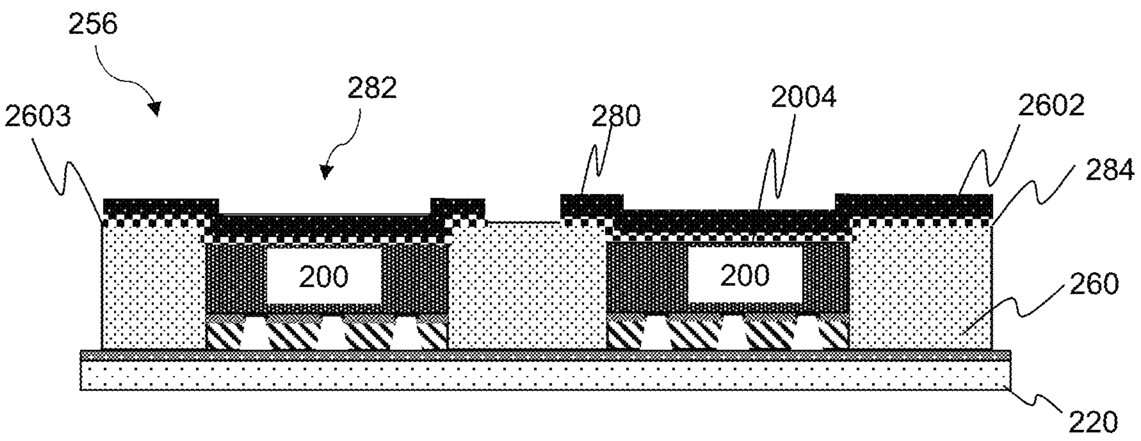

Step S250: conformally forming a conductive layer 280 along the cavity contour 270, i.e., at the die back surface 2004, the top surface 2602 of the molding layer 260 and the interface 272 therebetween; and a molded panel 256, 257 is formed. In a preferred embodiment, the conductive layer 280 has a substantially uniform thickness and conformally follows the cavity contour 270, such as the sharp profile 2721 or the sloped profile 2722 of the interface 272. Therefore, the conductive layer 280 also has a concave contour 282 conformally following the cavity contour 270 as shown in FIG. 14A/B. In some embodiments, the conductive layer 280 is extended to an edge 2603 of the top surface 2602 (FIG. 14A); and in other embodiments, the edge 2603 of the top surface 2602 is uncovered by the conductive layer 280 (FIG. 14B) but the conductive layer 280 is connected to the conducting structure 240 either directly or indirectly.

The conductive layer 280 may be made of any electrically conducting materials including metals such as Aluminum, Copper, Tin, Nickel, Gold, Silver, Titanium, Tungsten; or inorganics such as poly-silicon, or combinations or composites thereof. In a preferable embodiment, the conductive layer 280 is made of an electrically conducting material that is chemically compatible with the molding layer 260 so that the conductive layer 280 is secured onto the top surface 2602 of the molding layer 260. In a preferred embodiment, the conductive layer 280 is made of Titanium (Ti), Copper (Cu) or metallic composites (Ti/Cu) by any suitable methods such as electrical plating, chemical plating or sputtering.

Figure 14B:
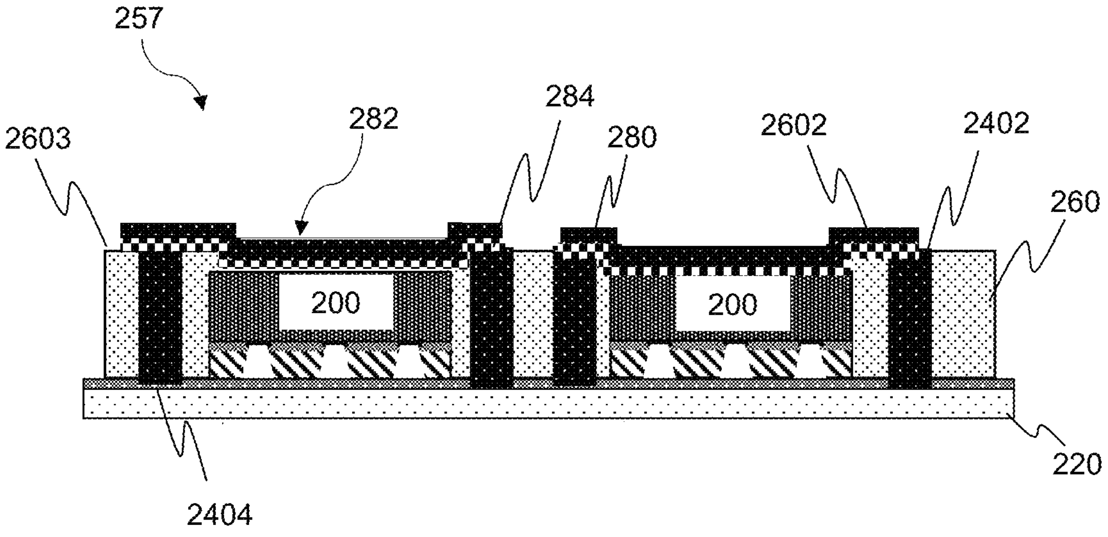

As shown in FIG. 14A/FIG. 14B, a seed layer 284 may be optionally formed conformally along the cavity contour 270 first before forming the conductive layer 280. The seed layer 284 is used for enhancing adherence of the conductive layer 280 to the top surface 2602 of the molding layer 260, the die back surface 2004 and the interface 272 therebetween. Accordingly, the seed layer 284 is preferably made of the same material or a compatible material with the conductive layer 280. For example, if the conductive layer 280 is formed with a Copper (Cu) sheet, the seed layer 284 may be made with sputtered Copper or a composite of Copper and Titanium (Cu/Ti). In particular, the seed layer 284 has a much smaller thickness than the conductive layer 280. For example, when the conductive layer 280 is around 10-20 μm, the seed layer 284 is preferably in a range of 1-5 μm, or more preferably 1-2 μm. The seed layer 284 is not shown in the following figures for simplicity of illustration. Preferably, the seed layer 284 has a substantially uniform thickness so as to conformally follow the cavity contour 270; and accordingly, the conductive layer 280 can retain the concave contour 282 together with the seed layer 284.

Figure 15A:
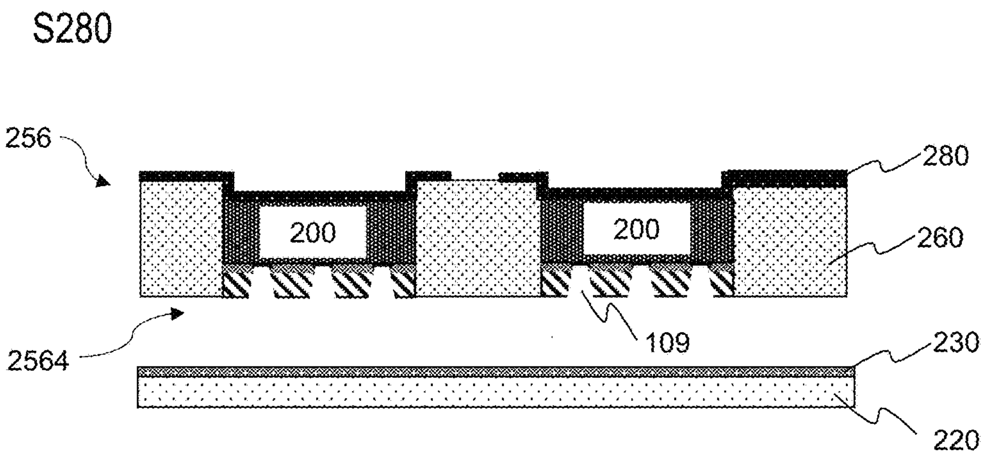

Step S280: optionally following directly from Step S250 (i.e. ignoring Steps S260 and S270), releasing the molded panel 256 from the carrier 220. Following FIG. 14A, the molded panel 256 is released from the carrier 220 and optionally the adhesive layer 230 as shown in FIG. 15A. Accordingly, the bottom surface 2604 of the molding layer 260 and the second surface 1074 of the protective layer 107 are exposed; while the die pad 103 is also exposed through the pre-vias 109. Then, the molded panel 256 is inverted and mounted to another carrier for filing the pre-vias 109 to form the filled vias 111 and for forming a build-up layer 290 on a bottom surface 2564 of the molded panel 256.

Figure 16A:
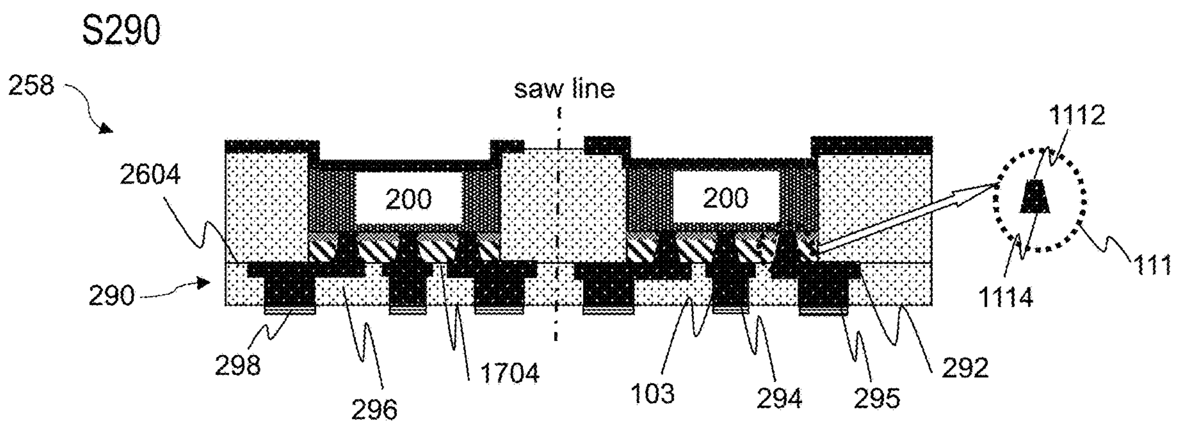

Step S290: filling the pre-vias 109 and forming the build-up layer 290 on the bottom surface 2564 of the molded panel 256 to form a molded panel 258. As shown in FIG. 16A, the pre-vias 109 is firstly filled with the conductive medium to form the filled vias 111 which has a first surface 1112 in contact with the die pads 103 and a second surface 1114 opposed to the first surface 1112 and exposed from the protective layer 107. The filling of the pre-vias 109 may be conducted in a single and continuous process with one conductive medium. Alternatively, the filling the pre-vias 109 may be conducted in a multi-step process with different conductive media for each step. For example, a composite Copper and Titanium (Cu/Ti) may be filled firstly in contact with the die pad 103 for a stable connection; then Copper is sputtered onto the composite for filling the rest of the pre-vias 109. Finally, the build-up layer 290 is formed on the bottom surface 2564 of the molded panel 256, i.e., the bottom surface 2604 of the molding layer 260 near the die 200, the second surface 1074 of the protective layer 107 and the second surface 1114 of the filled vias 111, to form the molded panel 258.

As shown in FIG. 16A, the build-up layer 290 includes a panel-level trace layer 292, multiple panel-level studs 294, and a build-up dielectric layer 296 which encapsulates the panel-level trace layer 292 completely and also the multiple panel-level studs 294 with an exposed surface 295 of the panel-level stud 294 exposed from the build-up dielectric layer 296. The panel-level trace layer 292 is disposed on the second surface 1074 of the protective layer 107 and the bottom surface 2604 of the molding layer 260; and then the panel-level studs 294 are disposed on the panel-level trace layer 292. Due to the exposed surface 295, the panel-level studs 294 can be electrically connected to external devices such as printed circuit board (PCB). Therefore, the die pads 103 are electrically led out in sequence via the filled vias 111, and the panel-level trace layer 292 and the panel-level studs 294 of the build-up layer 290. The panel-level studs 294 may be located within or beyond the footprint of the die 200 for a fan-in design or a fan-out design respectively. The build-up layer 290 in FIG. 16A has only one panel-level trace layer 292 for simplicity of illustration; but it is understood that the build-up layer 290 may have two or more panel-level trace layers 292 interconnected by panel-level vias (not shown); and the panel-level vias are formed by any method between every two of the multiple panel-level trace layers 292, such as laser or mechanical drilling. Finally, the panel-level studs 294 are formed on a final layer of the panel-level trace layer 292. Therefore, the die pad 103 is led out by the filled vias 111, the two or more panel-level trace layers 292, the panel-level vias and the panel-level studs 294.

The panel-level trace layer 292 and the panel-level studs 294 may be made of any electrically conducting materials including metals such as Aluminum, Copper, Tin, Nickel, Gold, Silver, Titanium, Tungsten; or inorganics such as poly-silicon, or combinations or composites thereof. In a preferable embodiment, the panel-level trace layer 292 is made of an electrically conducting material that is chemically compatible with the molding layer 260 so that the panel-level trace layer 292 is secured onto the bottom surface 2604 of the molding layer 260. While the build-up dielectric layer 296 is made of any electrically insulating materials for preventing electrical shortage in the build-up layer 290. The build-up dielectric layer 296 may contain one or more layers of photosensitive low curing temperature dielectric resist, photosensitive composite resist, laminate compound film, insulation paste with filler, solder mask resist film, liquid molding compound, silicon dioxide ($SiO_2$), silicon nitride ($Si_3N_4$), silicon oxynitride (SiON), aluminum oxide ($Al_2O_3$), or other material having similar insulating and structural properties. The dielectric layer 296 is deposited using printing, spin coating, spray coating, lamination, or other suitable process.

As shown in FIG. 16A, an active surface finish 298 is optionally formed onto the exposed surface 295 of the panel-level studs 294 for providing a very flat surface for Input/Output (I/O) such as solder balls so as to be connected to external components such as PCB. The active surface finish 298 may be made of a single layer of metals such as Tin or a single layer of metal composites such as Nickel/Gold. Alternatively, the active surface finish 298 may be made of multiple layers. In some embodiments, the active surface finish 298 is made of Electroless Nickel Immersion Gold (ENIG) which has a two-layer metallic surface finish with a first layer of Nickel plated on the panel-level studs 294 using an electroless chemical reaction; and then a very thin layer of Gold plated onto the layer of Nickel. In other embodiments, the active surface finish 298 is made of Electroless Nickel Electroless Palladium Immersion Gold (ENEPIG) which is formed by deposition of electroless Nickel onto the panel-level studs 294, followed by electroless palladium, and finally an immersion gold flash. The active surface finish 298 is chemically compatible with the I/O such as solder balls for improving stability of connection to the external components. The active surface finish 298 may have a thickness in a range of 1 to 10 μm, preferably 1 to 5 μm, or more preferably 1 to 3 μm.

Figure 17A:
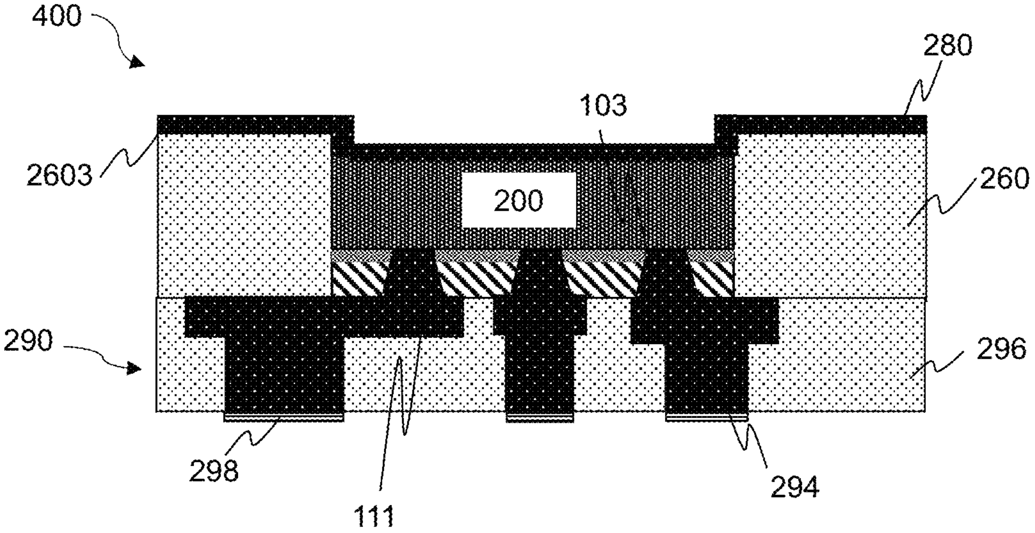

A process follows singulating the molded panel 258 into individual single-chip modules 400 in which the die 200 has only one chip (shown as the die 200). The chip may meet various purposes as maybe desired for electrical functions. As shown in FIG. 17A, the single-chip module 400 can be electrically connected to external components such as PCB only by electrically connecting the panel-level studs 294 exposed from the build-up layer 290 to the external components for communicating signals between the die pads 103 and the external components. While the conductive layer 280 can be used for dissipating heat more efficiently since the heat generated by the die 200 can be directly transmitted from the die back surface 2004 to the conductive layer 280 and finally to surrounding environment. In addition, the heat can also be transmitted from the die 200, via the molding layer 260 to the conductive layer 280, and finally to the surrounding environment.

Figure 18A:
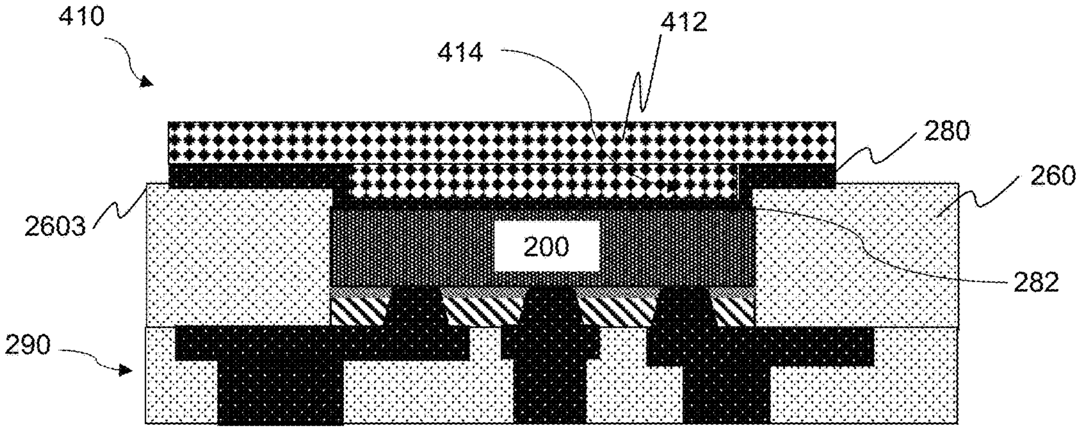

In a preferred embodiment, the conductive layer 280 is extended to the edge 2603 of the top surface 2602 for enhancing thermal dissipation. In another embodiment, thermal dissipation can be enhanced by disposing a heat sink 412 on the conductive layer 280 for a single-chip module 410 as shown in FIG. 18A in which the conductive layer 280 is not extended to the edge 2603 of the top surface 2602. Preferably, the heat sink 412 has a convex contour 414 which can be complementary to the concave contour 282 of the conductive layer 280. More preferably, the heat sink 412 on one hand completely covers the conductive layer 280 for more efficient heat dissipation; and on the other hand is not in contact with the top surface 2602 of the molding layer 260 to avoid causing too much internal stress in the single-chip module 410.

Figure 18B:
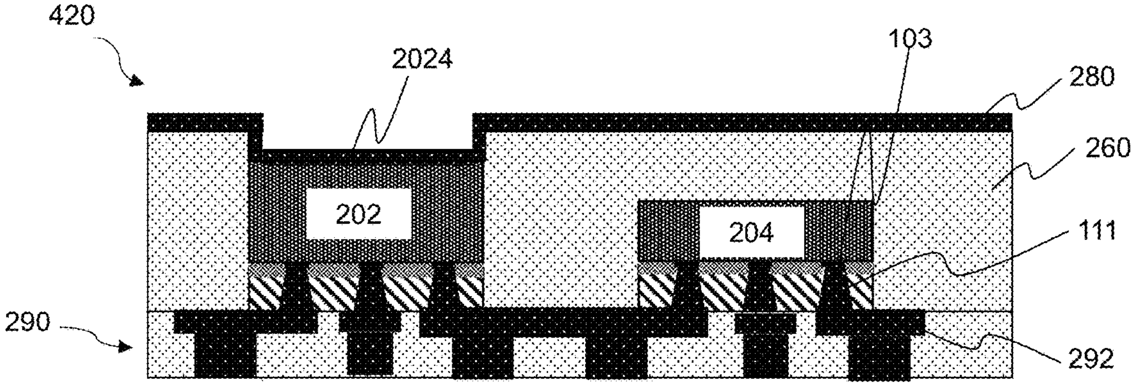

While described for making the single-chip modules 400, 410, the panel-level semiconductor packaging method 20 is also appliable to make a multi-chip module (MCM) when the die 200 includes two or more chips. As shown in FIG. 18B, a MCM 420 has a similar design as the single-chip module 400 in FIG. 17A except that the die 200 has a first chip 202 in contact with the conductive layer 280 and a second chip 204 completely encapsulated within the molding layer 260. The first chip 202 and the second chip 204 may have a same electrical function or different electrical functions. The MCM 420 is electrically connected to external components such as PCB via only the filled vias 111 and the build-up layer 290 for communicating signals between the die pads 103 of the chips 202, 204 to the external components. In addition, the first chip 202 and the second chip 204 can also communicate signals internally via the panel-level trace layer 292. Meanwhile, heat generated is dissipated to surrounding environment in two ways, i.e., directly from a chip back surface 2024 of the first chip 202 via the conductive layer 280, as well as from other sides of the first chip 202 and all sides of the second chip 204 via the molding layer 260. The former is more efficient since the conductive layer 280 is in contact with the chip back surface 2024 of the first chip 202.

Figure 18C:
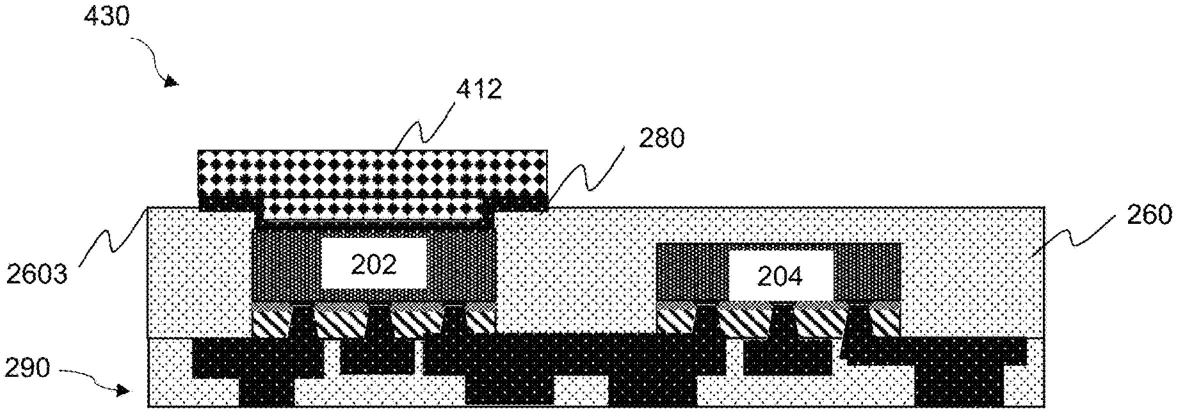

Likewise, the panel-level semiconductor packaging method 20 is also appliable to make a MCM 430 as shown in FIG. 18C. Similar to the MCM 420, the die 200 of the MCM 430 also has the first chip 202 and the second chip 204; and the first chip 202 is in contact with the conductive layer 280 and the second chip 204 is completely encapsulated within the molding layer 260. Similarly, the MCM 430 is electrically connected to external components such as PCB via the filled vias 111 and the build-up layer 290 for communicating signals between the die pads 103 of the chips 202, 204 to the external components. In addition, the first chip 202 and the second chip 204 can also communicate signals internally via the panel-level trace layer 292. Meanwhile, heat generated is also dissipated to surrounding environment in the two ways described for the MCM 420. However, the conductive layer 280 is only formed around the first chip 202; and the heat sink 412 is mounted onto the conductive layer 280 by placing the convex contour 414 complementary to the concave contour 282. The conductive layer 280 may not be extended to the edge 2603 of the molding layer 260 to avoid causing too much internal stress to the MCM 430. It is understood that the panel-level semiconductor packaging method 20 can product other multi-chip modules in which the die 200 may include two, three or more chips; and all these multi-chip modules fall within the scope of the present disclosure.

As shown in FIG. 8B, the pre-vias 109 of the die unit 210 are filled to form the filled vias 111 before the singulation for the wafer-level semiconductor packaging method 10. In this case, the filing process in FIG. 16A is skipped for the pre-vias 109. Steps S280 and S290 are then performed for forming the single-chip module 400, 410 or the MCM 420, 430 as described above. In Step S290, the build-up layer 290 is formed in the same way that the panel-level trace layer 292 is connected to the filled vias 111.

Figure 15B:
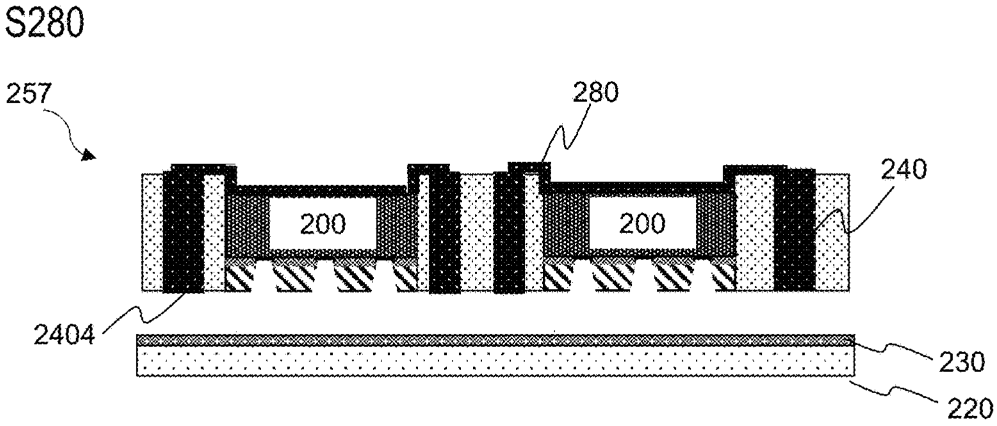
Figure 16B:
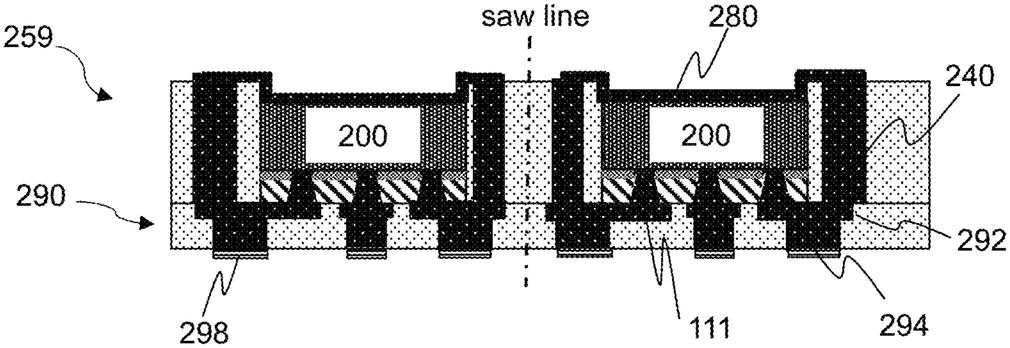
Figure 17B:
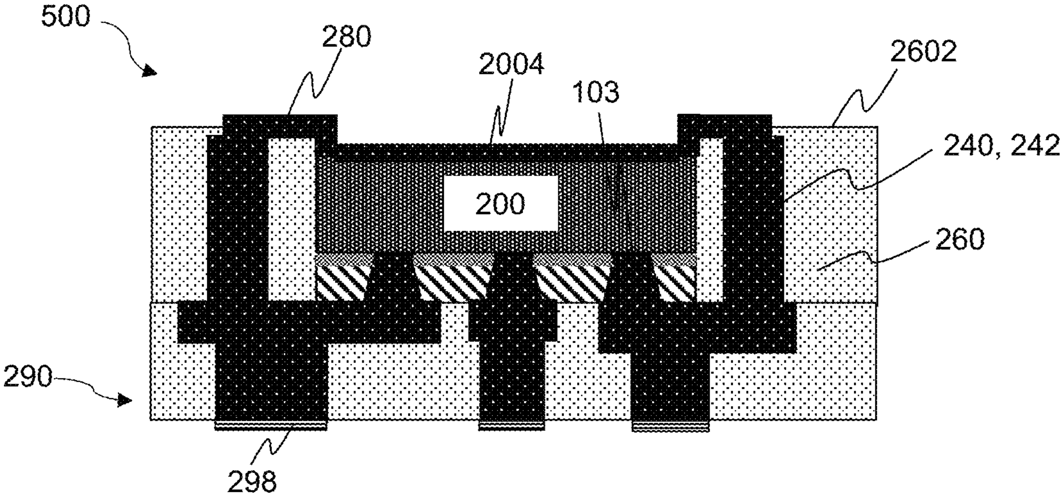

Steps S280 and S290 described in FIG. 15A and FIG. 16A are also applicable to the molded panel 257 with the conducting structure 240 in FIG. 14B. The conducting structure 240 is disposed on the carrier 220. As shown in FIG. 15B, the bottom surface 2404 of the conducting structure 240 is exposed from the bottom surface 2604 of the molding layer 260 after detaching the carrier 220 and optionally the adhesive layer 230. Then as shown in FIG. 16B, the build-up layer 290 is formed with the panel-level trace layer 292 and the panel-level studs 294, on the filled vias 111 which is either formed as described in Step S290 or previously formed as described in Step S17 in the wafer-level semiconductor packaging method 10. Therefore, the molded panel 259 is formed and then singulated into a single-chip module 500 as shown in FIG. 17B.

The single-chip module 500 has an advantage of flexible design for electrical connection or thermal dissipation. In some embodiments, the single-chip module 500 can be electrically connected to external components such as PCB from the die active surface 2002 via the filled vias 111 and the build-up layer 290, consistent with the description for the single-chip module 400. Similarly, the active surface finish 298 is also formed on the panel-level studs 294 for improving stability of connection to the external components. In other embodiments, the die pads 103 can be led out to the conductive layer 280 via the filled vias 111, the panel-level trace layer 292 and the conducting structure 240 for communicating signals from the die back surface 2004. In some other embodiments, the single-chip module 500 may be electrically connected to two external components from the die active surface 2002 and the die back surface 2004, respectively. Alternatively, the single-chip module 500 may dissipate heat more efficiently with the panel-level studs 294 of the build-up layer 290 or the conductive layer 280 exposed to surrounding environment.

Figure 19A:
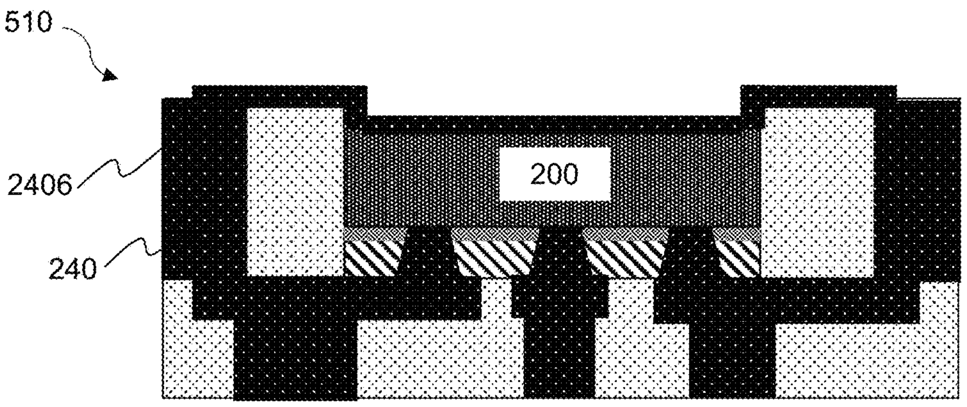

A single-chip module 510 with the conducting structure 240 is shown in FIG. 19A. Compared with the single-chip module 500, a side surface 2406 of the conducting structure 240 of the single-chip module 510 is exposed from the molding layer 260. The exposed side surface 2406 can enhance heat dissipation for the single-chip module 510. Multiple conducting structures 240 may be arranged at one, two, three or all four sides of the single-chip module 510 with the side surface 2406 exposed for further enhancing heat dissipation; and this is called six-sided cooling. Therefore, the single-chip module 510 is more suitable for power applications such as electrical automobiles.

Figure 19B:
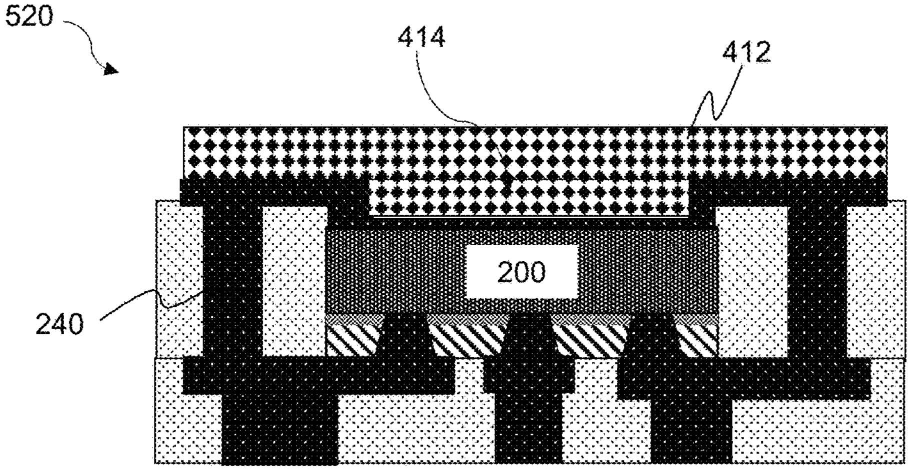
Figure 19C:
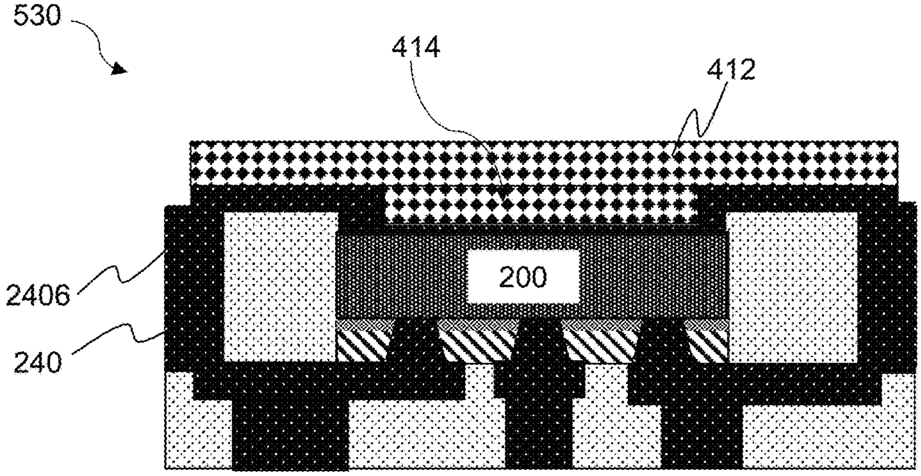

As shown in FIG. 19B/FIG. 19C, the heat sink 412 can also be mounted onto the single-chip modules 500, 510 by fitting the convex contour 414 of the heat sink 412 into the concave contour 282 of the conductive layer 280 to form single-chip modules 520, 530 respectively. For the single-chip module 530, more heat sinks (either with or without the convex contour 414) may be thermally connected to the exposed side surface 2406 for further enhancing the six-sided cooling, without causing additional stress to the die 200.

Figure 19D:
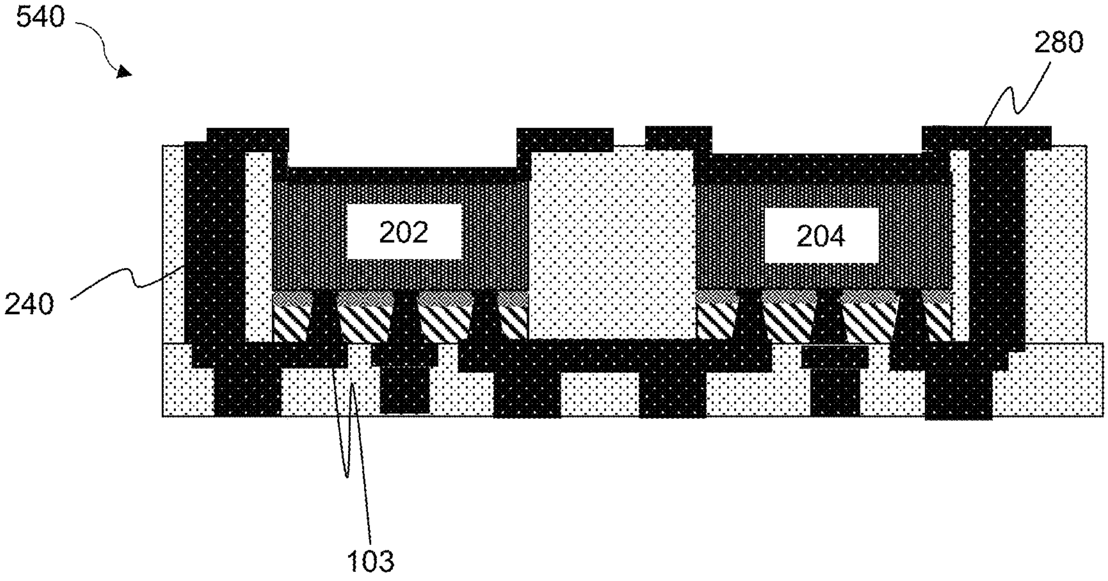
Figure 19E:
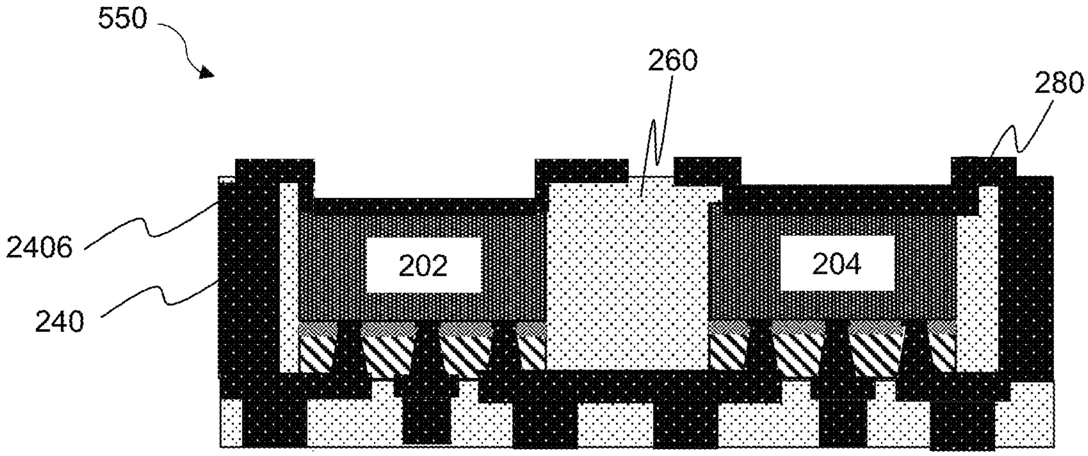

Similarly, a multi-chip module 540 can also be formed with the panel-level semiconductor packaging method 20 by including two or more chips for the die 200 such as the first chip 202 and the second chip 204 as shown in FIG. 19D. The die pads 103 of each chip 202, 204 can be led out to the conductive layer 280 on the die back surface 2004 via the conducting structure 240. Another multi-chip module 550 is shown in FIG. 19E which has a similar configuration with the multi-chip module 540 except that the side surface 2406 of the conducting structure 240 are exposed from the molding layer 260 for achieving the six-sided cooling. Similarly, additional heat sinks may be thermally connected to the exposed side surface 2406 for further enhancing the six-sided cooling, without causing additional stress to the chips 202, 204.

Figure 20A:
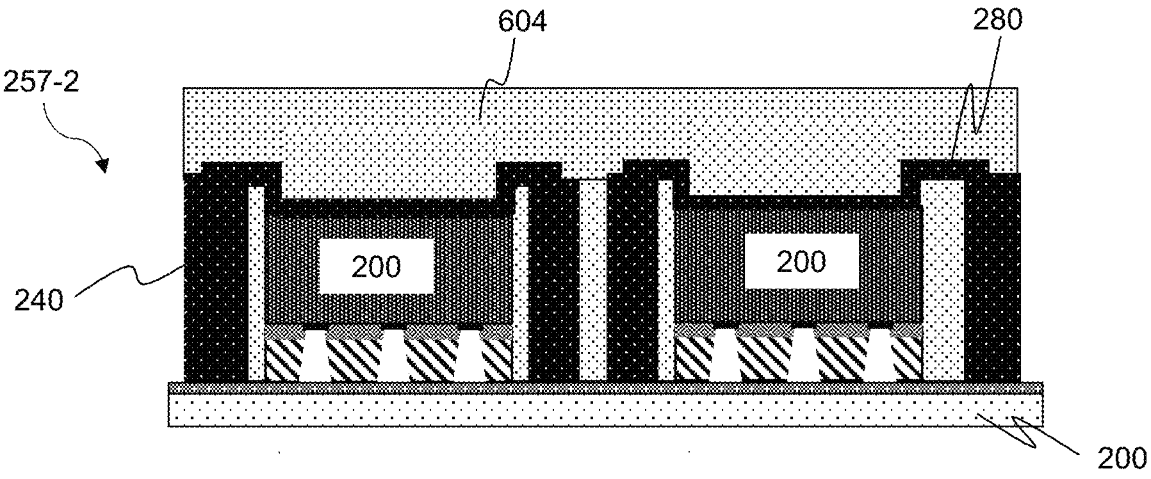
Figure 20B:
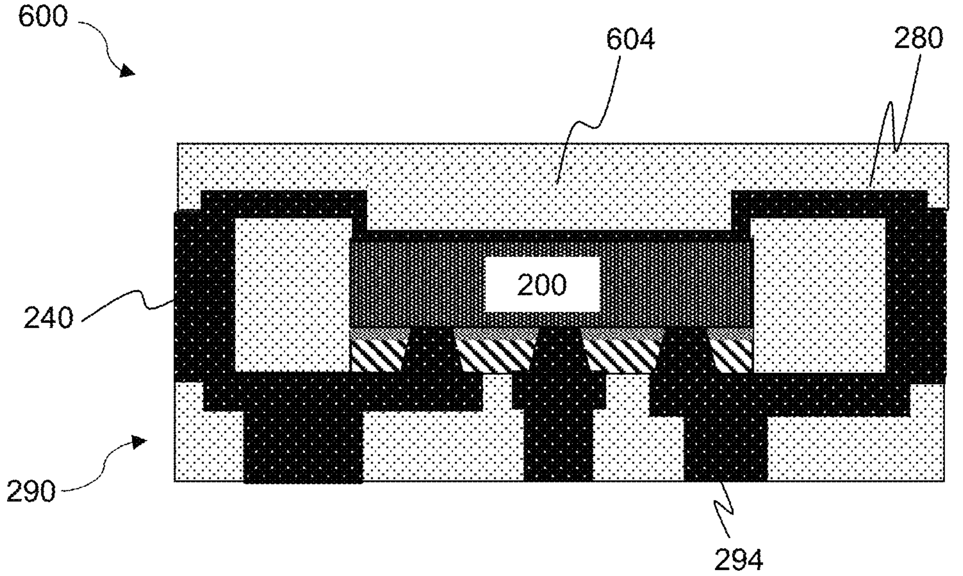
Figure 20C:
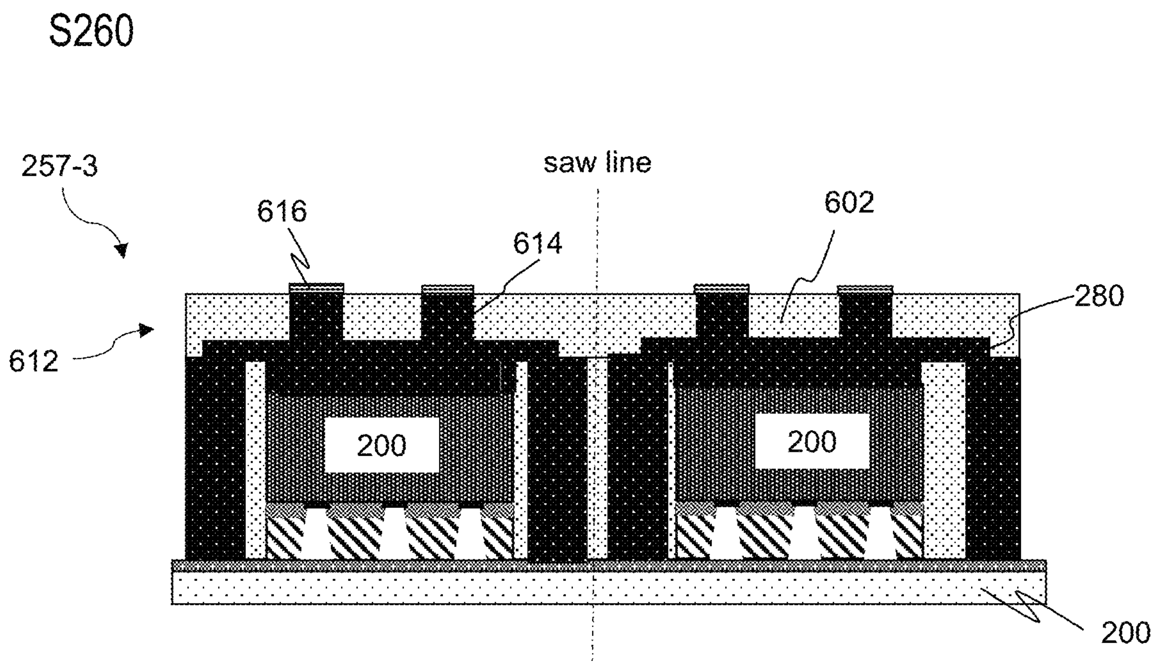

Step S270: optionally following from Step S250, applying a back dielectric layer 604 for encapsulating the conductive layer 280 to form a molded panel 257-2. As shown in FIG. 20A, the back dielectric layer 604 completely encapsulates the conductive layer 280 for protecting the conductive layer 280 from external damages. Then Steps S280 and S290 are then performed in the following as described above for forming a single-chip module 600 in FIG. 20B. Accordingly, the die pads 103 can only be led out from the die active surface 2002 to external components such as PCB, via the filled vias 111, and the panel-level trace layer 292 and the panel-level studs 294 of the build-up layer 290.

The back dielectric layer 604 may be made of any electrically insulating materials for preventing electrical shortage in the stud layer 612. The back dielectric layer 604 may contain one or more layers of photosensitive low curing temperature dielectric resist, photosensitive composite resist, laminate compound film, insulation paste with filler, solder mask resist film, liquid molding compound, silicon dioxide ($SiO_2$), silicon nitride ($Si_3N_4$), silicon oxynitride (SiON), aluminum oxide ($Al_2O_3$), or other material having similar insulating and structural properties. The back dielectric layer 604 is deposited using printing, spin coating, spray coating, lamination, or other suitable process. In a preferred embodiment, the back dielectric layer 604 is made of an electrically insulating but thermally conducting material for enhancing heat dissipation from the die back surface 2004.

Figure 20D:
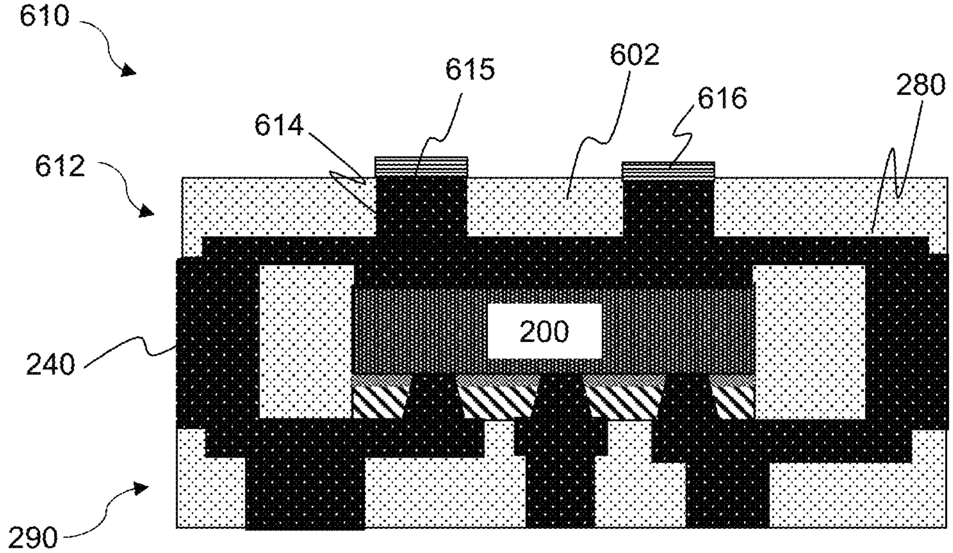
Figure 20E:
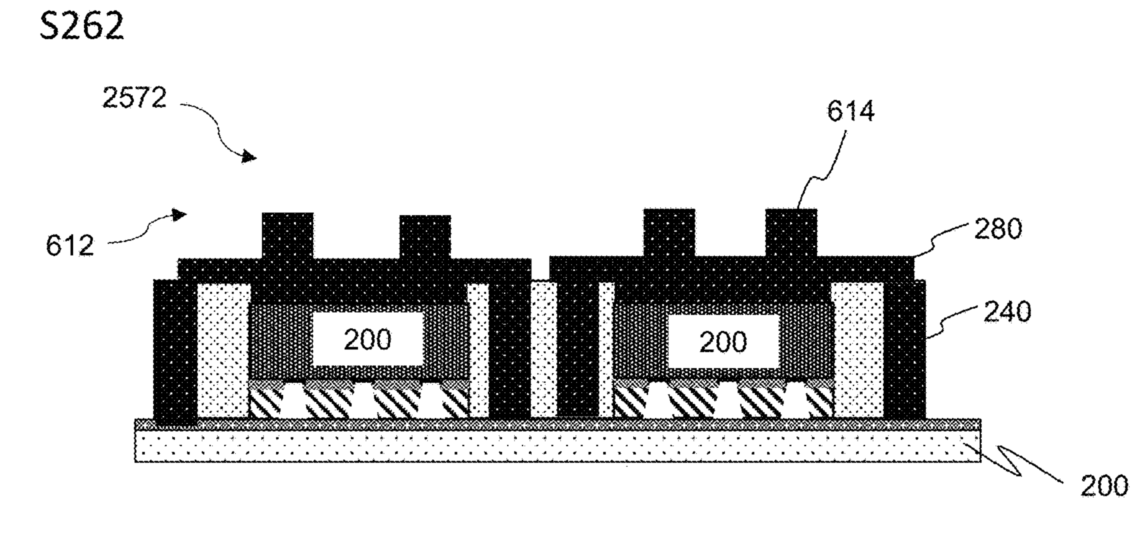
Figure 20F:
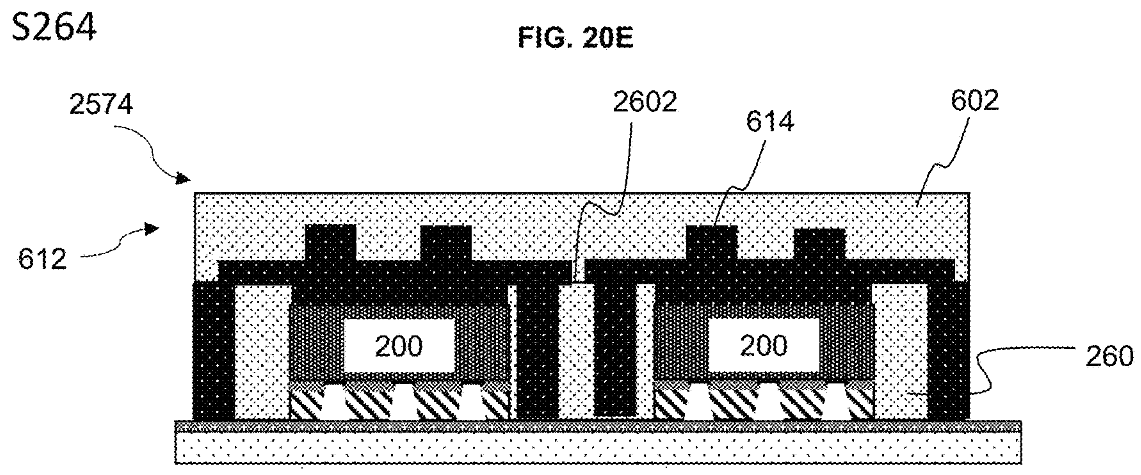
Figure 20G:
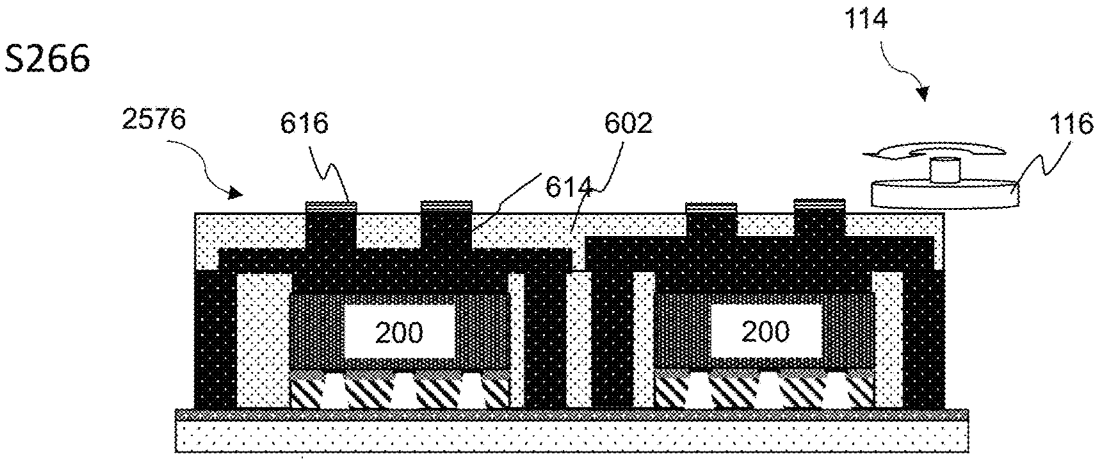

Following Step S250, Step S260 may be performed: optionally forming a stud layer 612 on the conductive layer 280 to form a molded panel 257-3. Step S260 may be conducted in three sub-steps to the molded panel 257-3. Firstly, Sub-step S262: as shown in FIG. 20E, forming conductive studs 614 in a desired pattern on the conductive layer 280 to form a molded panel 2572; and accordingly, the conductive studs 614 is electrically connected to the conducting structure 240 via the conductive layer 280. Then, Steps S280 and S290 may be followed as described above in which the conductive studs 614 is kept exposed completely. Secondly, as a matter of choice, Sub-step S264 may be optionally performed following Sub-step S262: as shown in FIG. 20F, applying a passivation layer 602 to the conductive studs 614 to completely encapsulate the conductive studs 614 and the conductive layer 280; and a molded panel 2574 is formed. Finally, Sub-step S266: as shown in FIG. 20G, exposing the conductive studs 614 from the passivation layer 602 by removing a top portion of the passivation layer 602, such as grinding or polishing to form a molded panel 2576. Following Sub-step S266, Step S280 and Step S290 are then performed in sequence as described above to the die active surface 2002 to form a single-chip module 610 in FIG. 20D.

The passivation layer 602 may be also made of any electrically insulating materials for protecting the conductive layer 280, such as photosensitive low curing temperature dielectric resist, photosensitive composite resist, laminate compound film, insulation paste with filler, solder mask resist film, liquid molding compound, silicon dioxide ($SiO_2$), silicon nitride ($Si_3N_4$), silicon oxynitride (SiON), aluminum oxide ($Al_2O_3$), or other material having similar insulating and structural properties. Since the passivation layer 602 is in contact with a portion of the top surface 2602 of the molding layer 260 which is not covered by the conductive layer 280, the passivation layer 602 is preferably made of an electrically insulating material chemically compatible with the molding layer 260. The passivation layer 602 is preferably made of a same electrically insulating material as the back dielectric layer 604.

In Sub-step S266, after exposing the conductive studs 614 from the passivation layer 602, a back surface finish 616 may be formed onto the conductive studs 614 for providing a very flat surface for Input/Output (I/O) such as solder balls so as to be connected to external components such as PCB. The back surface finish 616 may be made of a single layer of metals such as Tin or a single layer of metal composites such as Nickel/Gold. Alternatively, the back surface finish 616 may be made of multiple layers. In some embodiments, the back surface finish 616 is made of Electroless Nickel Immersion Gold (ENIG) which has a two-layer metallic surface finish with a first layer of Nickel plated on the conductive studs 614 using an electroless chemical reaction; and then a very thin layer of Gold plated onto the layer of Nickel. In other embodiments, the back surface finish 616 is made of Electroless Nickel Electroless Palladium Immersion Gold (ENEPIG) which is formed by the deposition of electroless Nickel onto the conductive studs 614, followed by electroless palladium, and finally an immersion gold flash. The back surface finish 616 is chemically compatible with the I/O such as solder balls for improving stability of connection to the external components. The back surface finish 616 may have a thickness in a range of 1 to 10 μm, preferably 1 to 5 μm, or more preferably 1 to 3 μm.

In addition to the passivation layer 602, the stud layer 612 also includes multiple conductive studs 614 which has an exposed surface 615 exposed from the passivation layer 602. The exposed surface 615 of the conductive studs 614 can be used for either heat dissipation or electrical connection from the passivation layer 602. In a preferred embodiment, the stud layer 612 has a flat surface with the exposed surface 615; and a heat sink may be mounted onto the stud layer 612 at the exposed surface 615 for further enhancing heat dissipation. The die pads 103 may be led out by the build-up layer 290 via the panel-level studs 294 to external components such as PCB; or by the conductive studs 614 via the panel-level trace layer 292, the conducting structure 240 and the conductive layer 280. In some other embodiments, the single-chip module 610 may be electrically connected to two external components from the conductive studs 614 and the panel-level studs 294 respectively. As described above, the back surface finish 616 may be formed on the exposed surface 615 of the conductive studs 614.

Figure 20H:
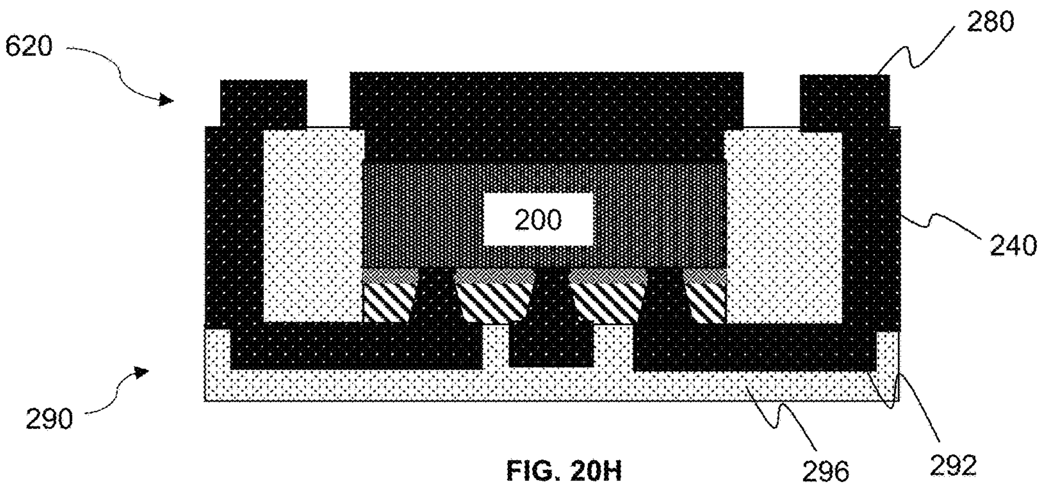

As shown in FIG. 20H, a single-chip module 620 can also be made by the panel-level semiconductor packaging method 20. The build-up layer 290 does not include the panel-level studs 294; and the panel-level trace layer 292 is completely encapsulated within the build-up dielectric layer 296. Therefore, the die pads 103 of the single-chip module 620 can only be led out via the conducting structure 240 and the conductive layer 280 from the die back surface 2004. In addition, the back dielectric layer 604 may be applied to the conductive layer 280 partially with a portion hereof to be exposed for the leading out.

Figure 20I:
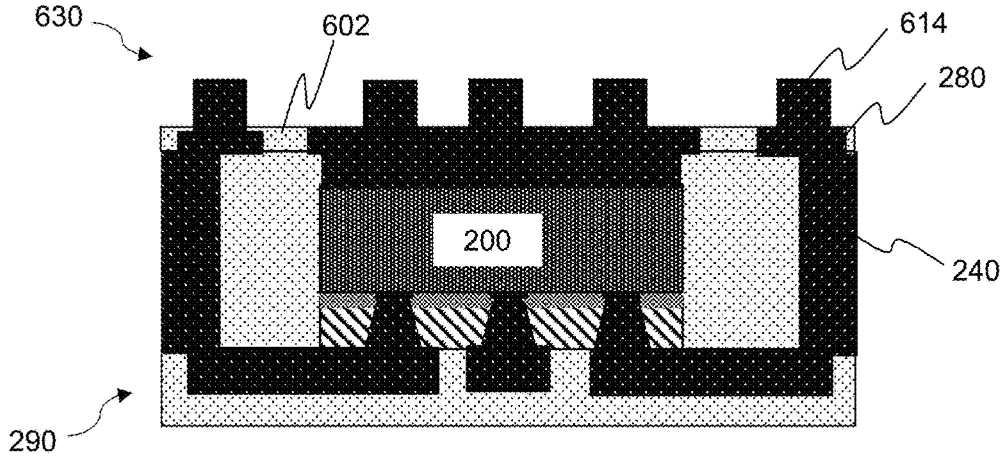

Another single-chip module 630 is shown in FIG. 20I, in which the conductive studs 614 are formed on the conductive layer 280, for electrical connection to external components such as PCB, or for thermal dissipation into surrounding environment. As shown in FIG. 20I, different from Sub-step S264, the passivation layer 602 is applied only to the conductive layer 280 so that the conductive studs 614 are not encapsulated for an external electrical connection. Alternatively, the conductive studs 614 may be formed in the same way as described for Sub-step S262; but the Sub-steps S264 and S266 may not be performed for applying the passivation layer 602; and therefore, the conductive layer 280 and the conductive studs 614 are fully exposed for external electrical connection. Alternatively, all the 3 sub-steps S262, S264, S266 are applied in which the conductive layer 280 and the conductive studs 614 are encapsulated in the passivation layer 602, with the exposed surface 615 of the conductive studs 614 exposed for external electrical connection.

Figure 20J:
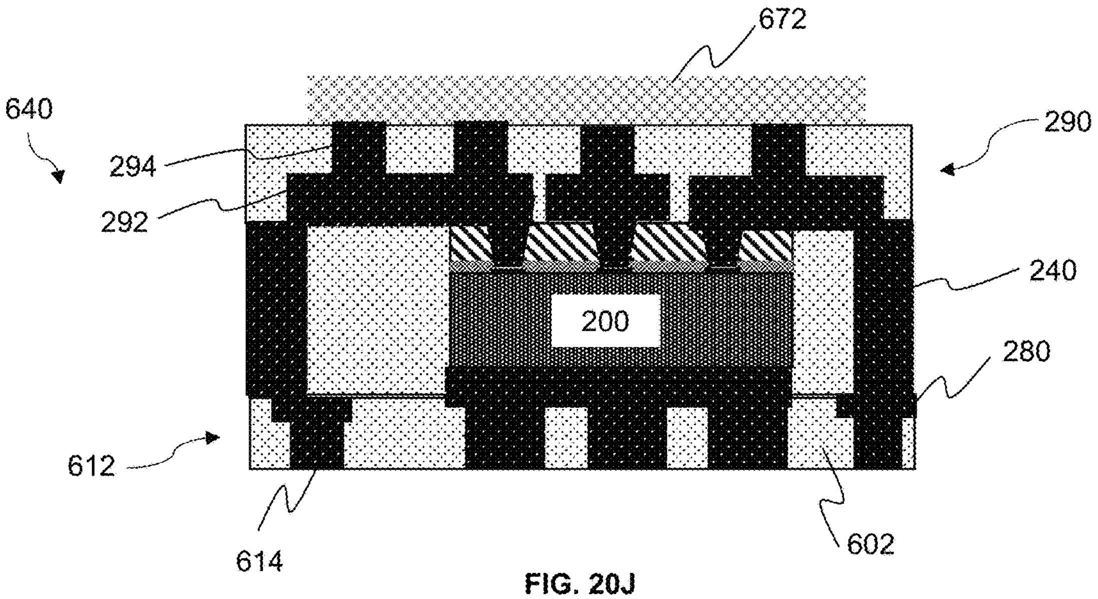

Another single-chip module 640 is shown in FIG. 20J, in which the passivation layer 602 is applied to the conductive studs 614 to form the stud layer 612 as described in Sub-step S264. Then the exposed surface 615 of the conductive studs 614 are exposed from the passivation layer 602 as described in Sub-step S266 so as to provide electrical connection to external components such as PCB or for heat dissipation to surrounding environment. In addition, another semiconductor package 672 may be mounted onto the panel-level studs 294 of the build-up layer 290. The single-chip module 640 and the semiconductor package 672 can communicate signals via the build-up layer 290 for forming a package-on-package (PoP) configuration; while the semiconductor package 672 can also be electrically connected to the external components such as PCB via the build-up layer 290, the conducting structure 240, the conductive layer 280 and the conductive studs 614. Alternatively, the semiconductor package 672 may be mounted to the stud layer 612 via the conductive studs 614, the conductive layer 280 and the conducting structure 240 for forming the PoP configuration. In some embodiments, the single-chip module 640 may be sandwiched between two semiconductor packages 272 for signal communication via the panel-level studs 294, the panel-level trace layer 292, the conducting structure 240, the conductive layer 280 and the conductive studs 614 or vice versa.

Figure 20K:
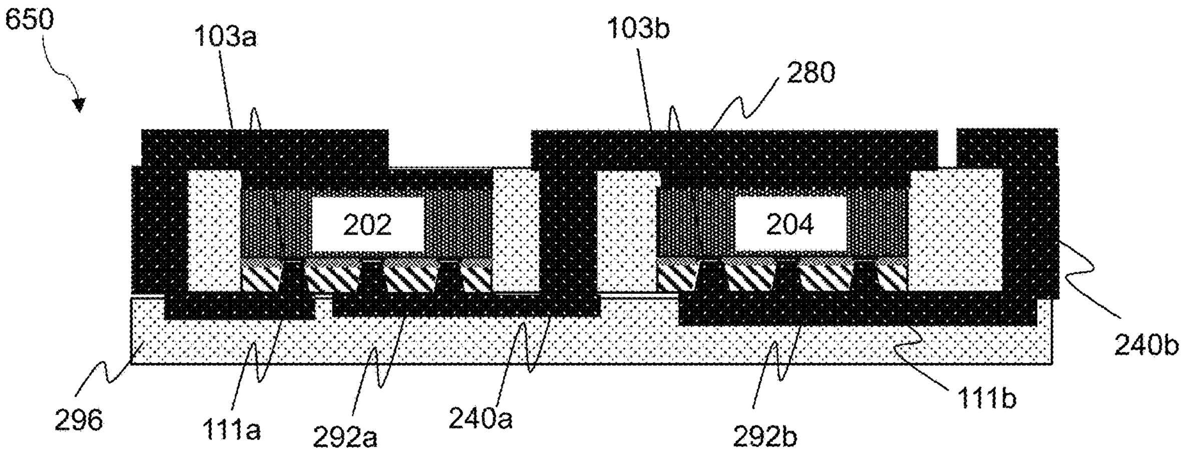
Figure 20L:
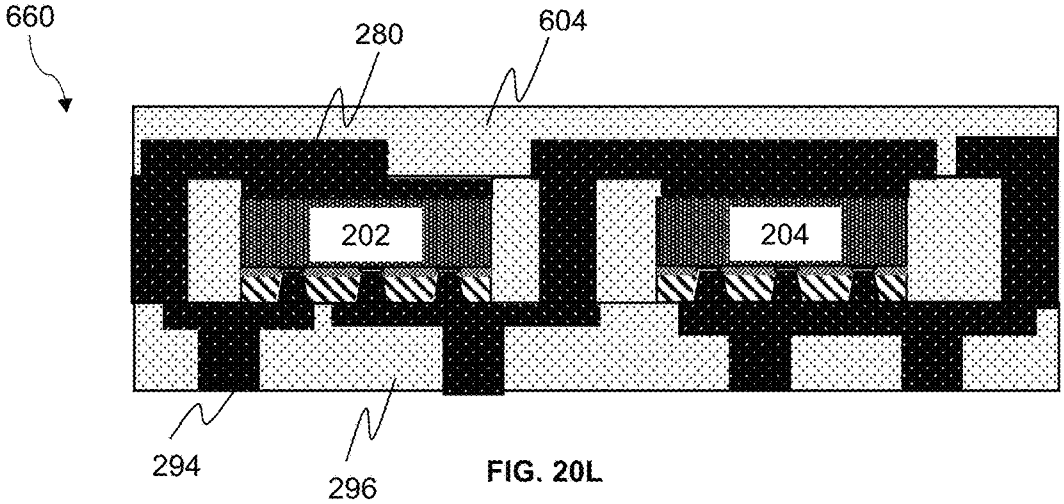
Figure 20M:
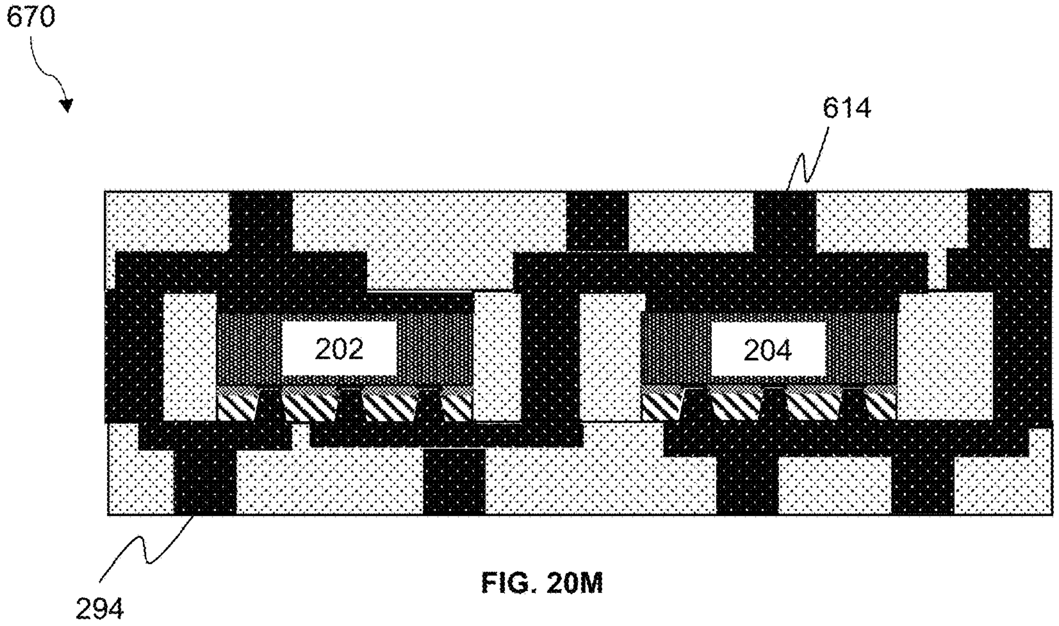

A variety of multi-chip modules (MCMs) may be also formed with the conducting structure 240. In one embodiment, as shown in FIG. 20K, a multi-chip module (MCM) 650 is connected to external components such as PCB only from the die back surface 2004 via the conducting structure 240 and the conductive layer 280, since the panel-level trace layer 292 is completely encapsulated within the build-up dielectric layer 296 of the build-up layer 290. In another embodiment, as shown in FIG. 20L, a multi-chip module 660 in which the panel-level studs 294 are exposed from the build-up dielectric layer 296 while the conductive layer 280 is completely encapsulated within the back dielectric layer 604, so that the multi-chip module 660 can be connected to external components such as PCB only from the die active surface 2002 via the panel-level studs 294 of the build-up layer 290. In another embodiment, as shown in FIG. 20*m*, a multi-chip module 670 which can be connected to an external component such as PCB from either the die active surface 2002 via the panel-level studs 294 or from the die back surface 2004 via the conductive layer 280 and the conductive studs 614 for communicating signals between the die pads 103 of the chips 202, 204 and the external component such as PCB. A PoP configuration may be formed by mounting another semiconductor package (such as the semiconductor package 672) to either the panel-level studs 294 or the conductive studs 614.

In addition, for the variety of multi-chip modules (MCMs) such as the multi-chip module (MCM) 650, 660, 670, signal communication can be achieved internally between the first chip 202 and the second chip 204 in two ways. Firstly, the panel-level trace layer 292 may directly connect the die pads 103 of the first chip 202 and the second chip 204 through their respective filled vias 111. If the first way of direct connection is not possible, the first chip 202 and the second chip 204 may be secondly connected indirectly by the panel-level trace layer 292, the conductive layer 280 and the conducting structure 240. For example, for the multi-chip module 650 in FIG. 20K the die pad 103*a* of the first chip 202 is led out to the die pad 103*b* of the second chip 204 in sequence through the filled vias 111*a*, a first portion 292*a* of the panel-level trace layer 292, a first conducting structure 240*a*, the conductive layer 280, a second conducting structure 240*b*, a second portion 292*b* of the panel-level trace layer 292 and the filled vias 111*b* for the internal signal communication. The same description is also applicable to the multi-chip modules 660, 670 for both the direct connection and the indirect connection. The direct connection allows a shorter travel path for the internal signal to communicate between the chips 202, 204 more rapidly; while the indirect connection allows a more flexible and complicated design for the multi-chip modules.

Figure 21:
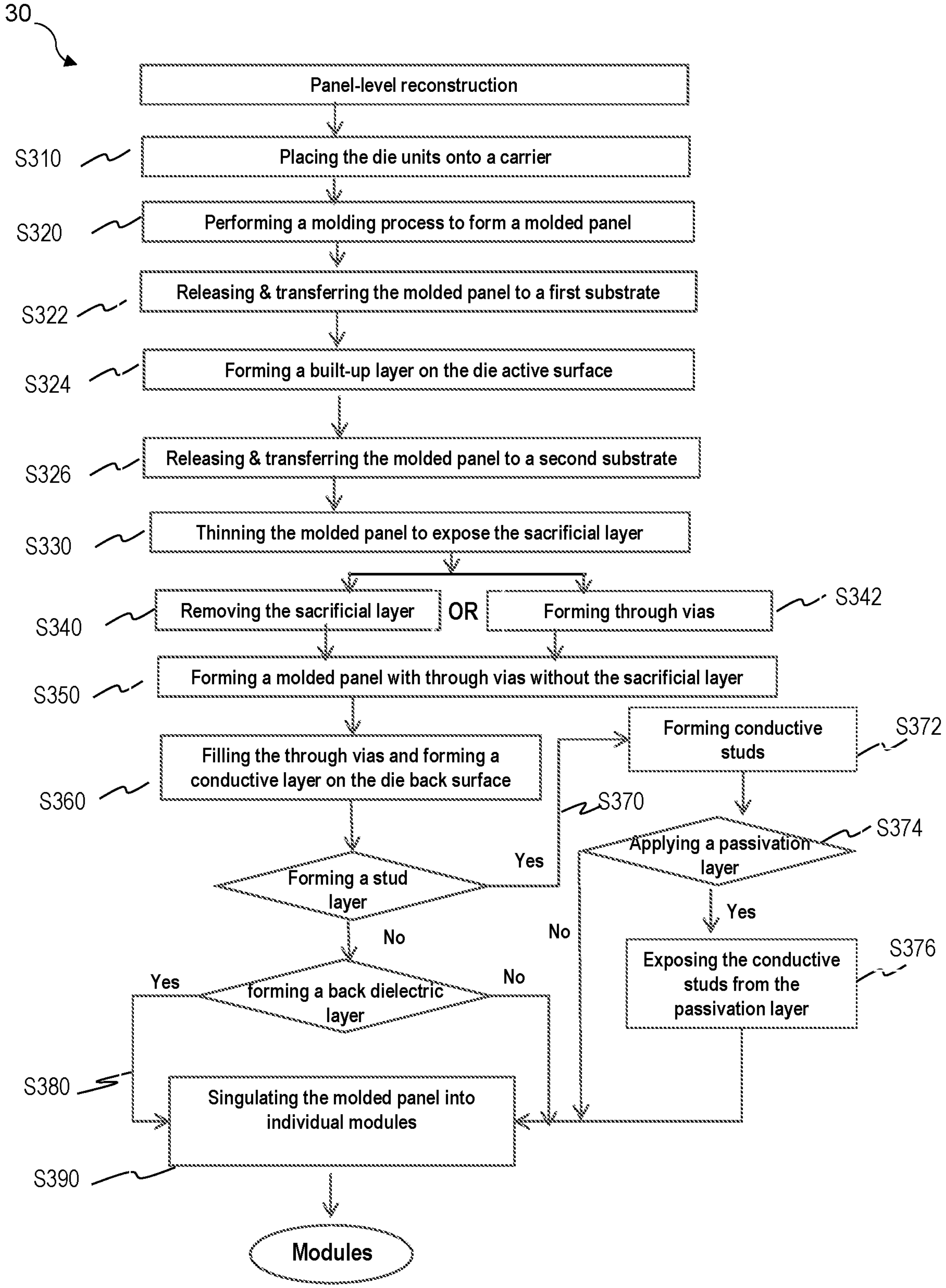
FIG. 21 illustrates a schematic diagram of another panel-level semiconductor packaging method 30 following the wafer-level semiconductor packaging method 10 depicted in FIG. 1 according to an exemplary embodiment of the present disclosure.

FIG. 21 illustrates a flow chart of another panel-level semiconductor packaging method 30, following the wafer-level semiconductor packaging method 10 in FIG. 1, as an exemplary embodiment of the present disclosure. Alternative to the panel-level semiconductor packaging method 20, the Copper column 242 is replaced by filled-through vias 340 as the conducting structure 240.

Figure 22A:
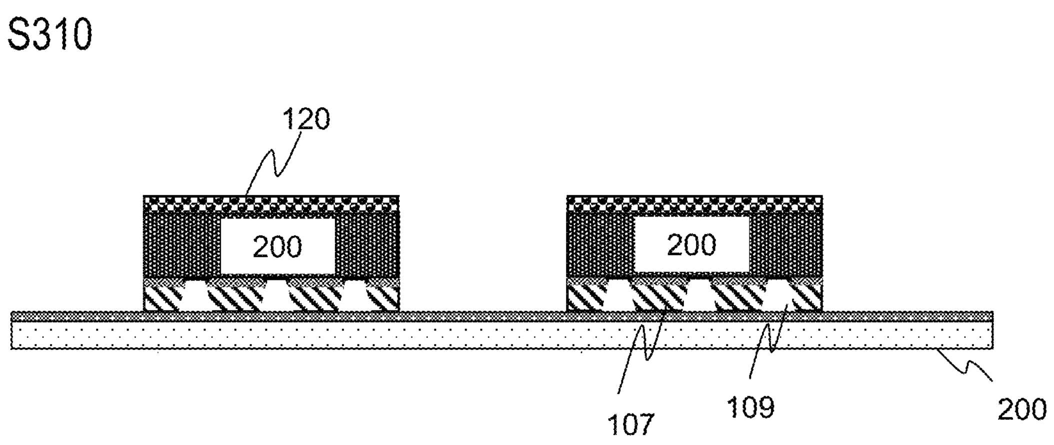
FIGS. 22A to 25D illustrate schematic diagrams of single-chip modules and multi-chip modules according to the flow chart in FIG. 21 for various exemplary embodiments of the present disclosure.

Step S310: disposing the die units 210 formed in the wafer-level semiconductor packaging method 10 onto the carrier 220 in the face-down manner. The Step S310 is performed in the same way as Step S210; and all the descriptions for FIG. 10A is applicable for Step S310 as shown in FIG. 22A. Similarly, only the die units 210 with the pre-vias 109 unfilled is shown herein for simplicity of illustration; and it is understood that the panel-level semiconductor packaging method 30 is also applicable to the die units 210 with the filled vias 111.

Figure 22B:
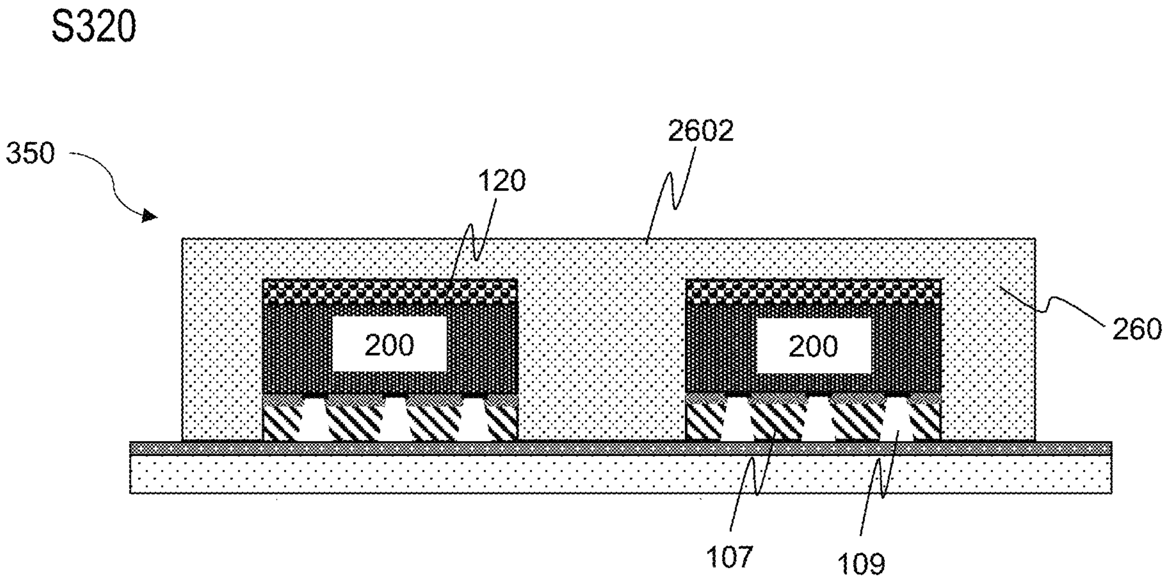

Step S320: performing a molding process to form a molded panel 350 with the molding layer 260. Step S320 is performed in the same way as Step S220; and all the descriptions for FIG. 11A is applicable to Step S320 as shown in FIG. 22B. In a preferred embodiment, the molding layer 260 completely encapsulates the sacrificial layer 120; and the top surface 2602 of the molding layer 260 has a flat surface for performing Step S322 more easily and securely.

Figure 22C:
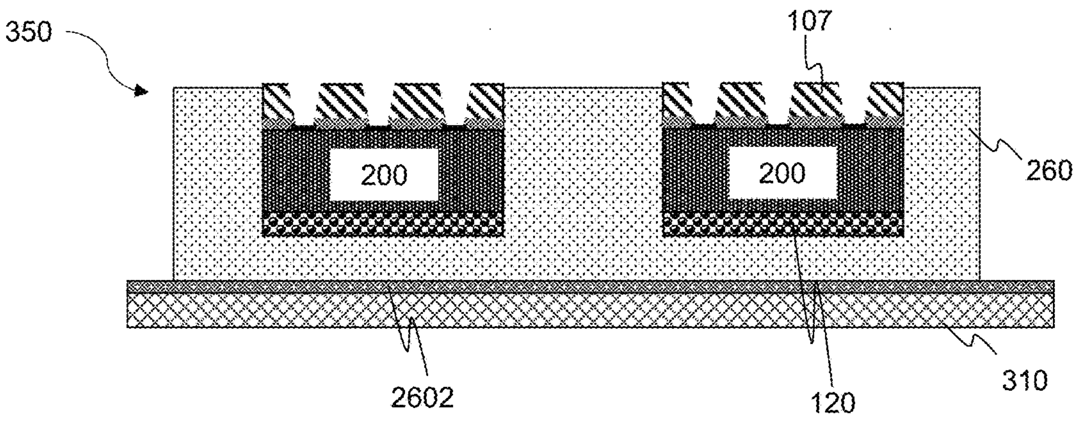

Step S322: releasing the molded panel 350 from the carrier 220 and then transferring the molded panel 350 to a first substrate 310 in a flipped manner. As shown in FIG. 22C, the molded panel 350 is inverted; and the top surface 2602 of the molding layer 260 is now in contact with the first substrate 310; and the pre-vias 109 previously facing to the carrier 220 now face away from the first substrate 310; and the die pad 103 on the die active surface 2002 is exposed from the pre-vias 109. The pre-vias 109 are subsequently filled to form the filled vias 111. Alternatively, the filled vias 111 are formed in the wafer-level semiconductor packaging method 10 as shown in FIG. 8B.

Figure 22D:
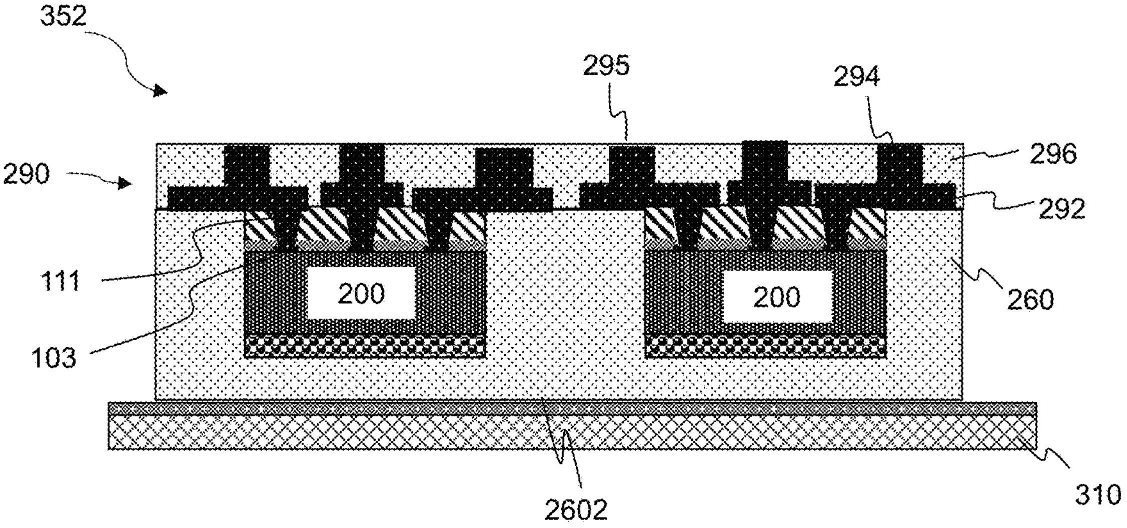

Step S324: forming the build-up layer 290 on the filled vias 111 from the die active surface 2002 to form a molded panel 352. As shown in FIG. 22D, the build-up layer 290 has the panel-level studs 294 and the panel-level trace layer 292 electrically connected in sequence to the filled vias 111. In a preferred embodiment, the build-up dielectric layer 296 of the build-up layer 290 has a flat surface at the exposed surface 295 of the panel-level studs 294.

Figure 22E:
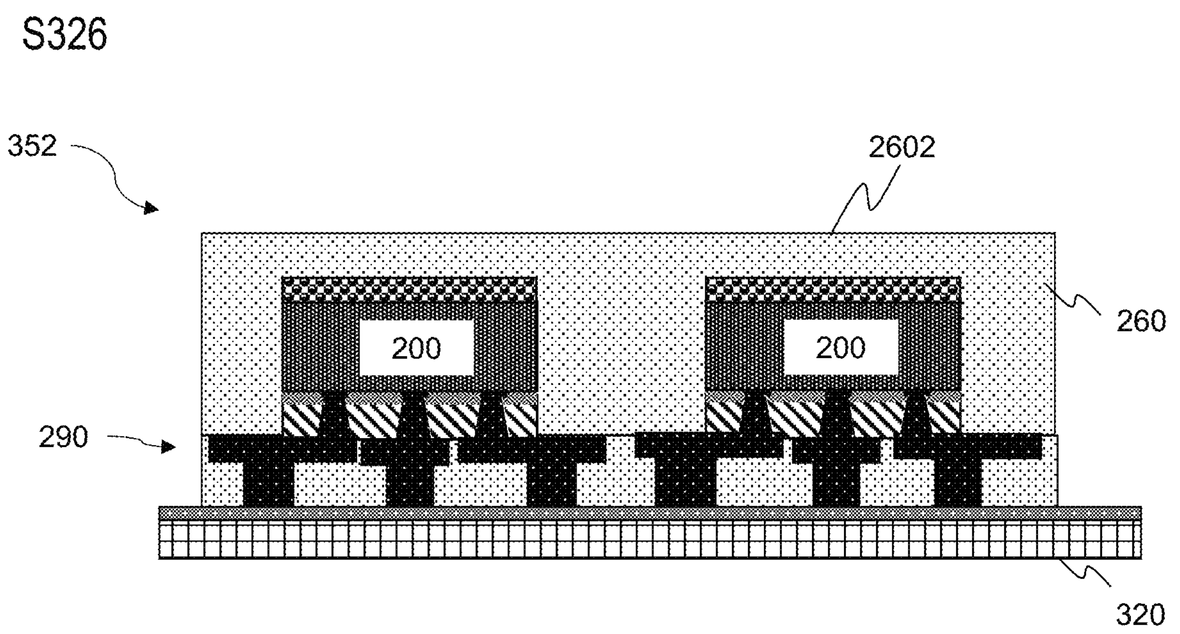

Step S326: releasing the molded panel 352 from the first substrate 310 and then transferring the molded panel 352 onto a second substrate 320 in the flipped manner. As shown in FIG. 22*e*, the molded panel 352 is inverted; and the top surface 2602 of the molding layer 260 previously facing to the first substrate 310 now faces away from the second substrate 320.

Figure 22F:
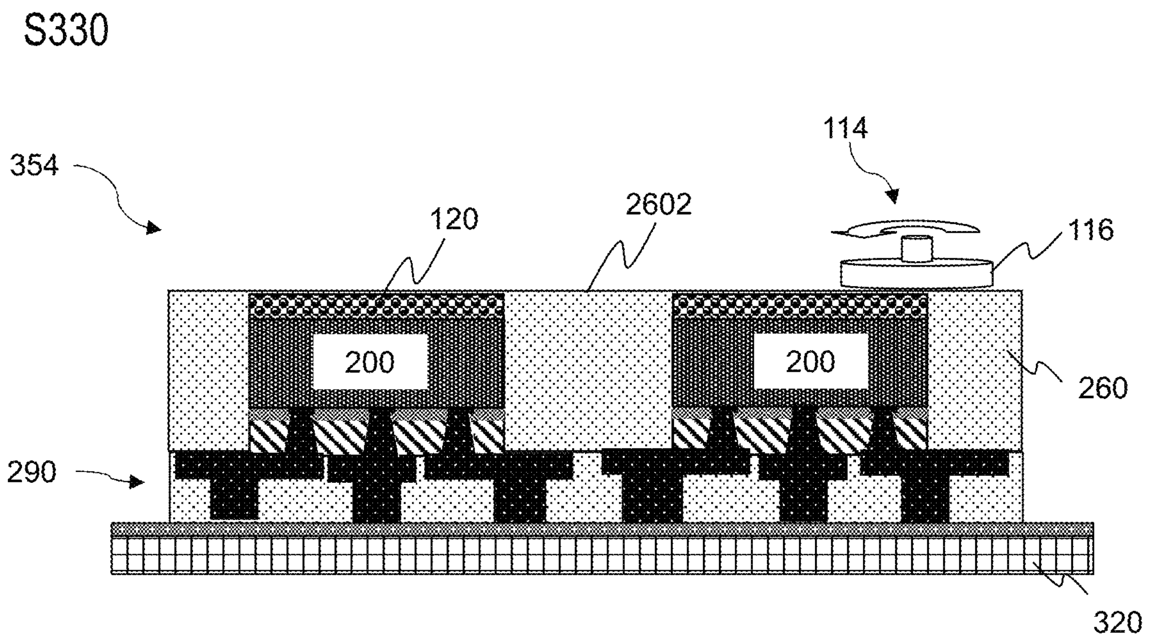

Step S330: thinning the molded panel 352 to expose the sacrificial layer 120 to form a molded panel 354. Step S330 may be conducted in the same way as Step S230; and all the descriptions for FIG. 12A is applicable for Step S330 as shown in FIG. 22*f*. The backgrinding equipment or grinder 114 with a grinding wheel 116 is shown for an example. Accordingly, the sacrificial layer 120 is exposed from the top surface 2602 of the molding layer 260. Therefore, due to the existence of the sacrificial layer 120, the thinning process is not performed directly onto the die back surface 2004 of the die 200; and the present disclosure solves the risk of die cracking with the current backgrinding process on the die back surface 2004 by avoiding a direct contact to the die back surface 2004, particularly if the die 200 is made of the next generation semiconductor materials such as Silicon Carbide (SiC) and Gallium Nitride (GaN) which has greater hardness and brittleness than Silicon (Si).

Step S340: removing the sacrificial layer 120 from the die back surface 2004 to form a molded panel 356. Step S340 may be conducted in the same way as Step S240; and all the descriptions for FIG. 13A is applicable for FIG. 22G-1. In a preferred embodiment, the sacrificial layer 120 is completely removed from the die back surface 2004 without residue so that the die back surface 2004 is completely exposed for forming electrical/thermal contact with the conductive layer 280. Similarly, the interface 272 may have the vertical profile 2721 or the sloped profile 2722 as described above. Embodiments with the vertical profile 2721 are shown for simplicity of illustration; but it is understood that Step S340 and all following steps can be applicable to embodiments with the sloped profile 2722 in a same or similar way.

Figures 1, 22G:
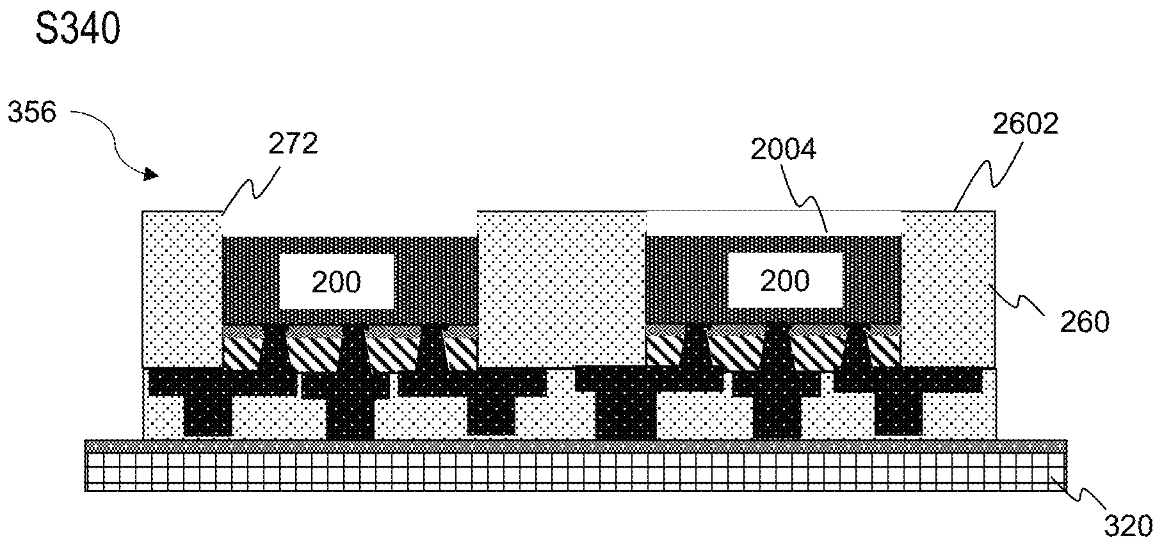
Figures 2, 22G:
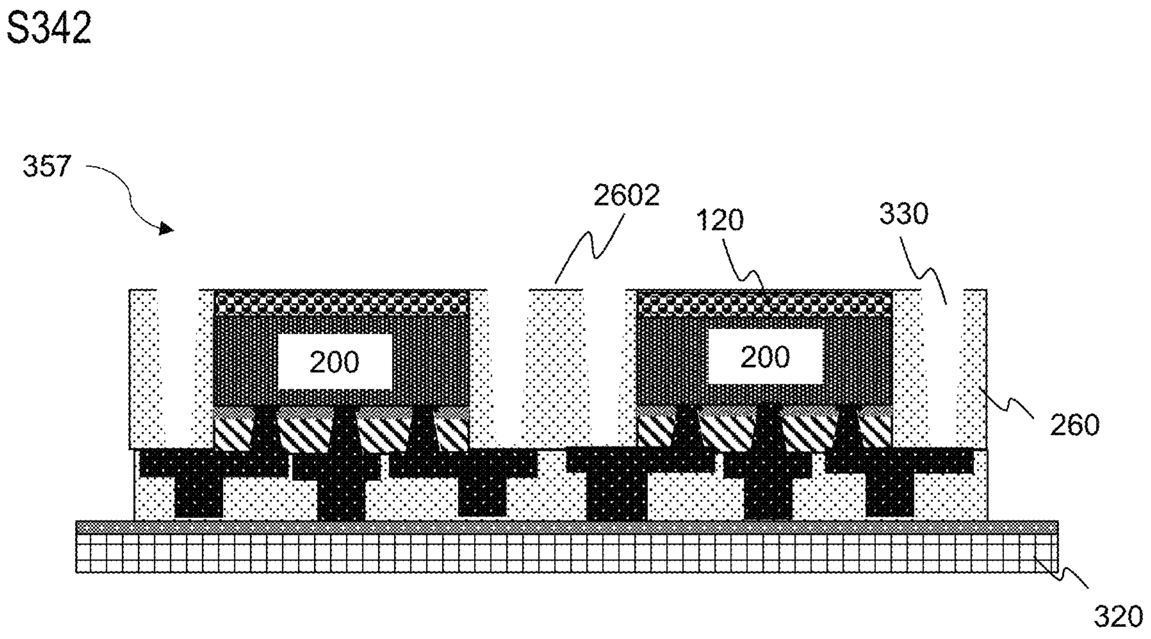
Figure 22H:
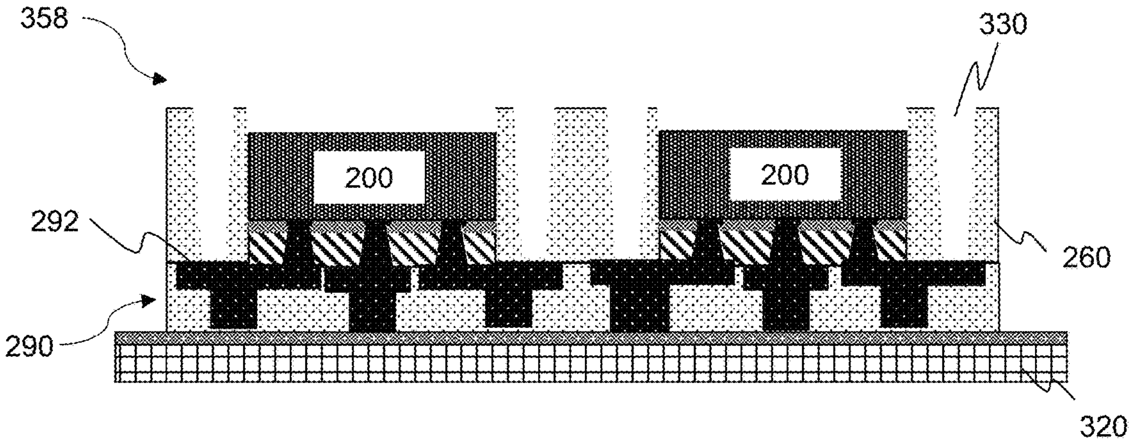

Step S350: forming through vias 330 in the encapsulant layer 260 to form a molded panel 358. As shown in FIG. 22H, the through vias 330 are formed through the encapsulant layer 260 at certain positions; and a portion of the panel-level trace layer 292 is exposed from the through vias 330. The through vias 330 may be formed by any suitable methods, such as laser drilling, laser ablation, plasma etching or any combination thereof. The through vias 330 may have a V-shaped configuration and a smooth side wall for facilitating a subsequent filling process to form the filled-through vias 340. The cavity contour 270 is still kept in FIG. 22H at the interface 272.

Alternative to Step S340, Step S342 may be performed following Step S330. Step S342: forming through vias 330 in the molding layer 260 to form a molded panel 357. As shown in FIG. 22G-2, the through vias 330 are formed without removing the sacrificial layer 120 from the molded panel 354. In a preferred embodiment, the second surface 1204 of the sacrificial layer 120 is flush or co-planar with the top surface 2602 of the molding layer 260. After forming the through vias 330, the sacrificial layer 120 is then removed subsequently for forming the same molded panel 358 as shown in FIG. 22H. Alternatively, Step S340 and Step S342 may be combined to remove the sacrificial layer 120 and to form the through vias 330 as a single step or simultaneously for improving production efficiency.

Figure 22I:
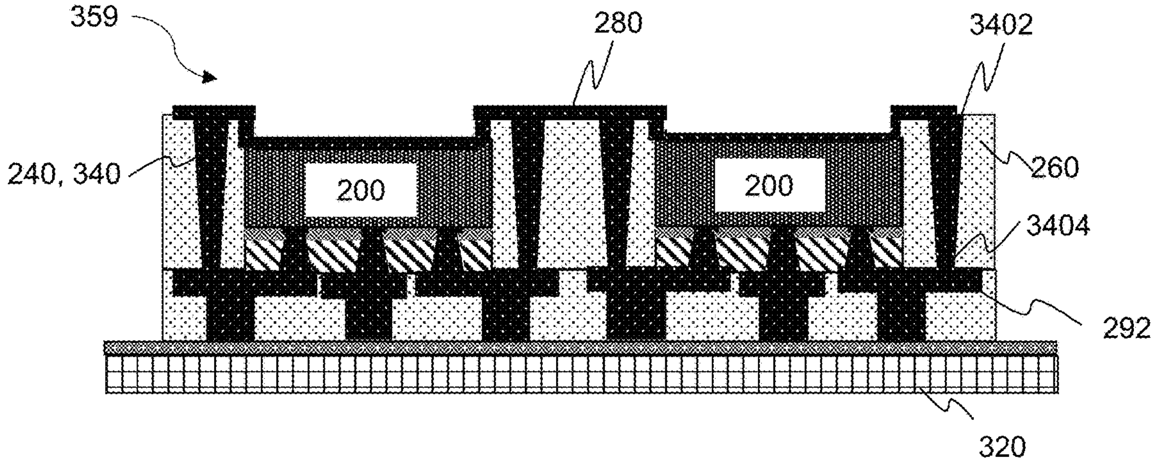

Step S360: filling the through vias 330 with a conductive medium to form the filled-through vias 340 as the conducting structure 240 and also to form the conductive layer 280 on the die back surface 2004, so as to form a molded panel 359. The conductive medium may be gold, silver, copper, tin, aluminum and the like, or a combination thereof, or other suitable metals or metal composites by physical vapor deposition (PVD), chemical vapor deposition (CVD), sputtering, electrolytic electroplating, electrodeless electroplating, or other suitable metal deposition processes. In a preferred embodiment, the formation of the filled-through vias 340 and the conductive layer 280 are performed in a single and continuous filling process. As shown in FIG. 22I, the filled-through vias 340 has a top surface 3402 in contact with the conductive layer 280 and a bottom surface 3404 in contact with the panel-level trace layer 292 for leading out the die pads 103 via the filled vias 111. Following the V-shaped configuration of the through vias 330, the top surface 3402 of the filled-through vias 340 has a larger area than the bottom surface 3404.

Figure 22J:
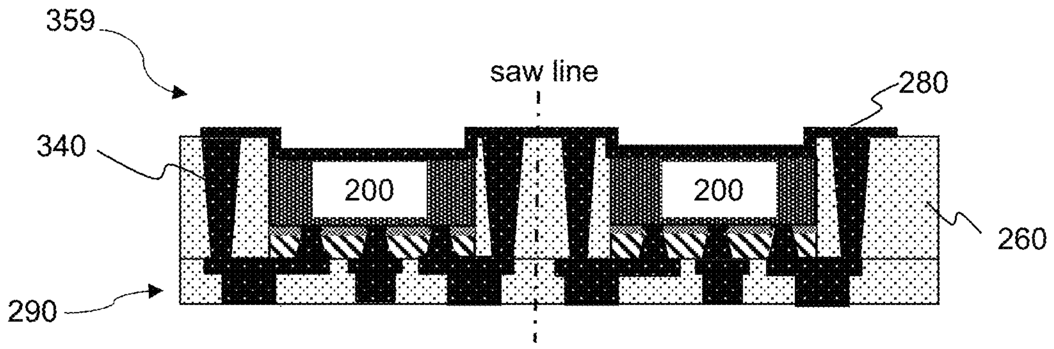
Figure 23:
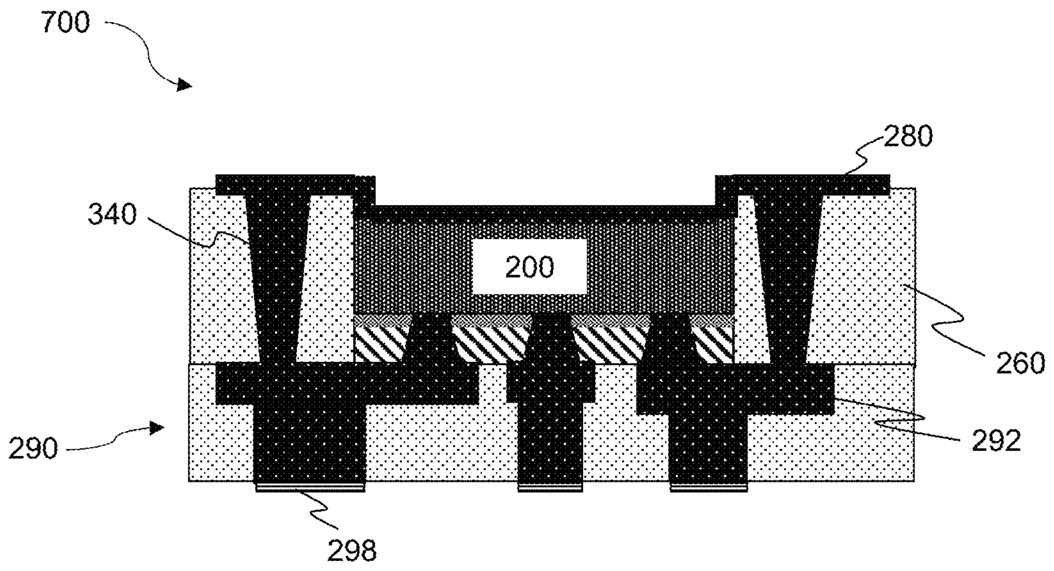

Step S390: optionally and following directly Step S360, singulating the molded panel 359 along saw lines as shown in FIG. 22J into individual single-chip modules, such as a single-die module 700 shown in FIG. 23. The single-die module 700 is similar to the single-chip module 500 in FIG. 17B, except that the filled-through vias 340 are used as the conducting structure 240, instead of the Copper column 242 for electrically connecting the panel-level trace layer 292 and the conductive layer 280. Due to the filling process in Step S360, a sidewall of the filled-through vias 340 is encapsulated inside the molding layer 260 and cannot be exposed to surrounding environment.

Figure 24A:
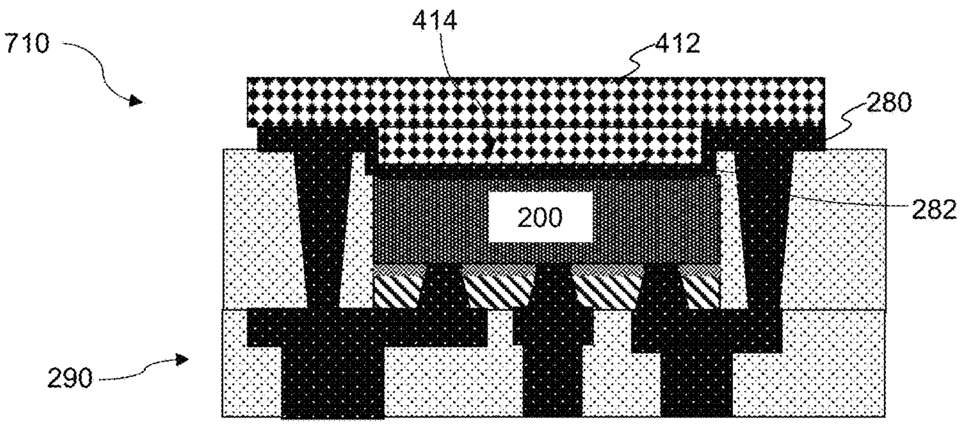

Similar to the single-chip module 520 in FIG. 19*b*, the heat sink 412 may be mounted to the conductive layer 280 by fitting the convex contour 414 of the heat sink 412 complementarily into the concave contour 282 of the conductive layer 280 to form a single-chip module 710, as shown in FIG. 24A.

Figure 24B:
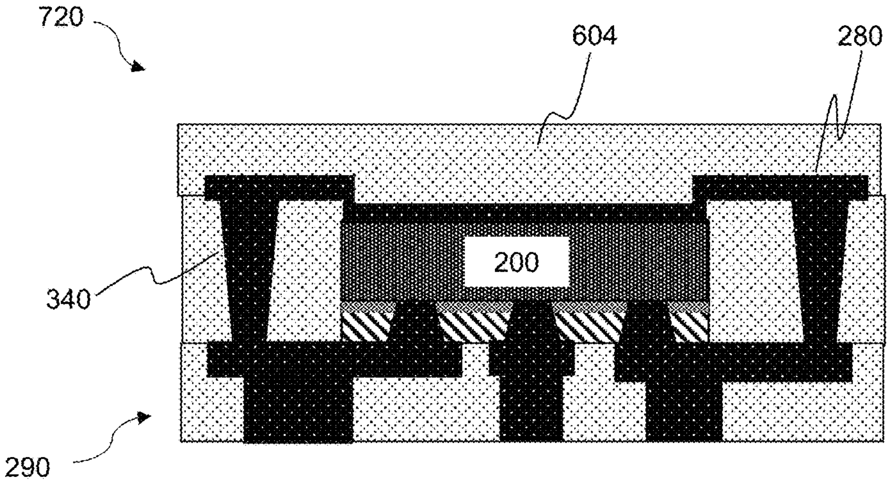

Optionally and following Step S360, Step S380 is performed in the same manner as Step S270 to form the back dielectric layer 604 to completely encapsulate the conductive layer 280 to form a single-chip module 720, as shown in FIG. 24B. Preferably, the back dielectric layer 604 is made of an electrically insulating but thermally conducting material for dissipating heat from the die back surface 2004.

Figure 24C:
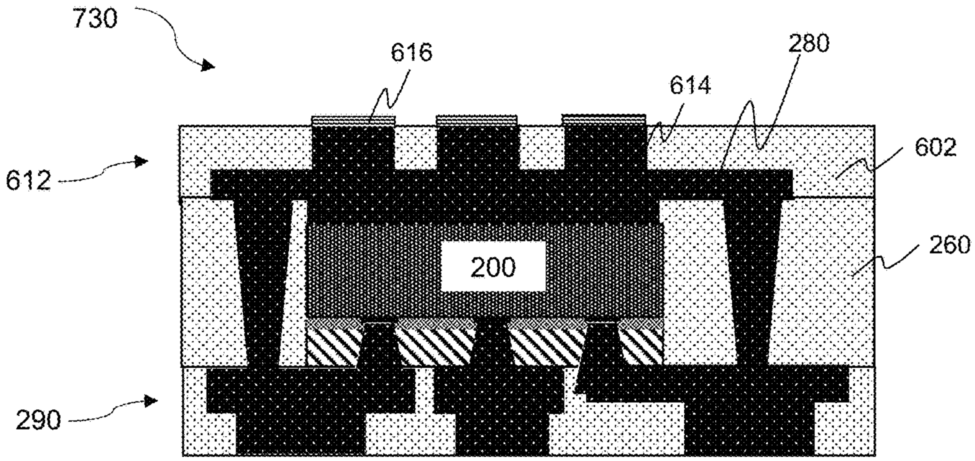
Figure 24D:
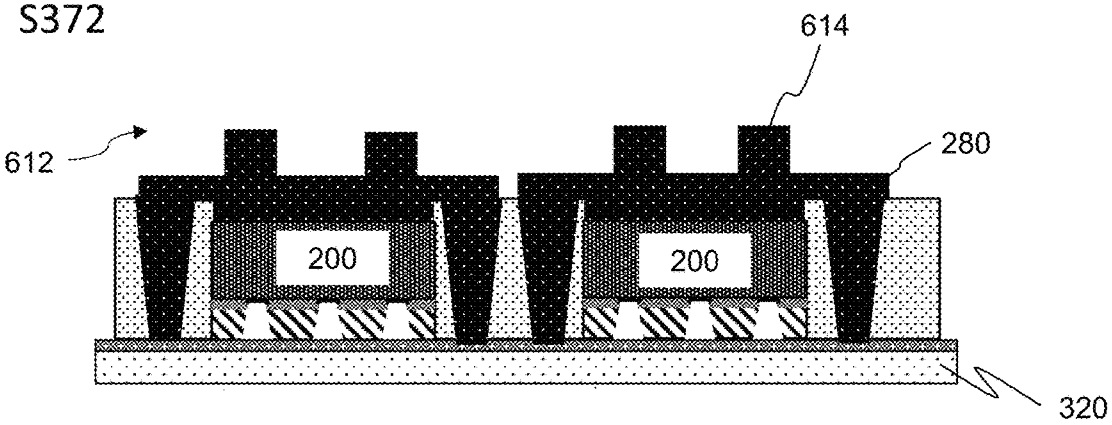
Figure 24E:
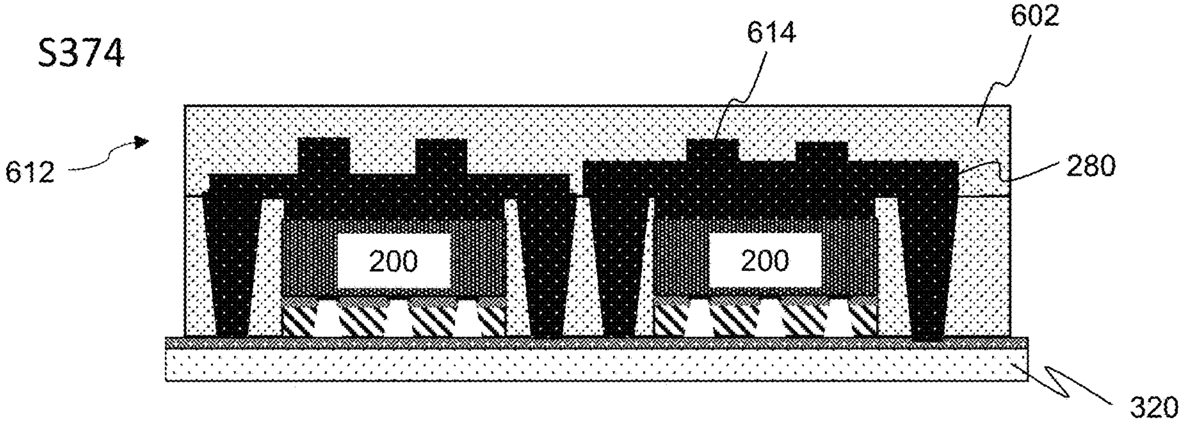
Figure 24F:
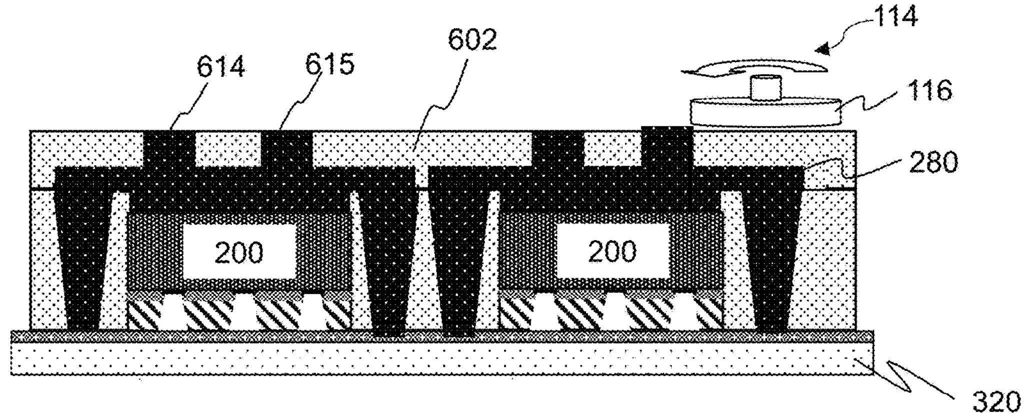

Optionally and following Step 360, Step S370 is optionally performed in the same manner as Step S260 to form the stud layer 612 on the conductive layer 280 and the molding layer 260. Step S370 may also be conducted in Sub-steps S372, S374 and S376, similar to Sub-steps S262, S264 and S266, for forming the conductive studs 614 in a desired pattern onto the conductive layer 280 (Sub-step S372 as shown in FIG. 24D); then Step S390 may be performed to reach a semiconductor module with the conductive studs 614 completely exposed. As a matter of choice, optionally continue with applying the passivation layer 602 to the conductive layer 280 and the conductive studs 614 (Sub-step S374 as shown in FIG. 24E); and for exposing the exposed surface 615 of the conductive studs 614 from the passivation layer 602 by grinding, polishing or other suitable methods, such as a backgrinding equipment or grinder 114 with a grinding wheel 116 (Sub-step S376 as shown in FIG. 24F). After performing Step S390, a single-chip module 730 is made as shown in FIG. 24C. The single-chip module 730 may have thermal/electrical connections from the panel-level studs 294 of the build-up layer 290 from the die active surface 2002, or from the conductive layer 280 from the die back surface 2004, or from both two ways. It is also understood that the single-chip modules 700, 710 720, 730 are described herein as embodiments only, and other single-chip modules can also be made by the panel-level semiconductor packaging method 30.

Figure 25A:
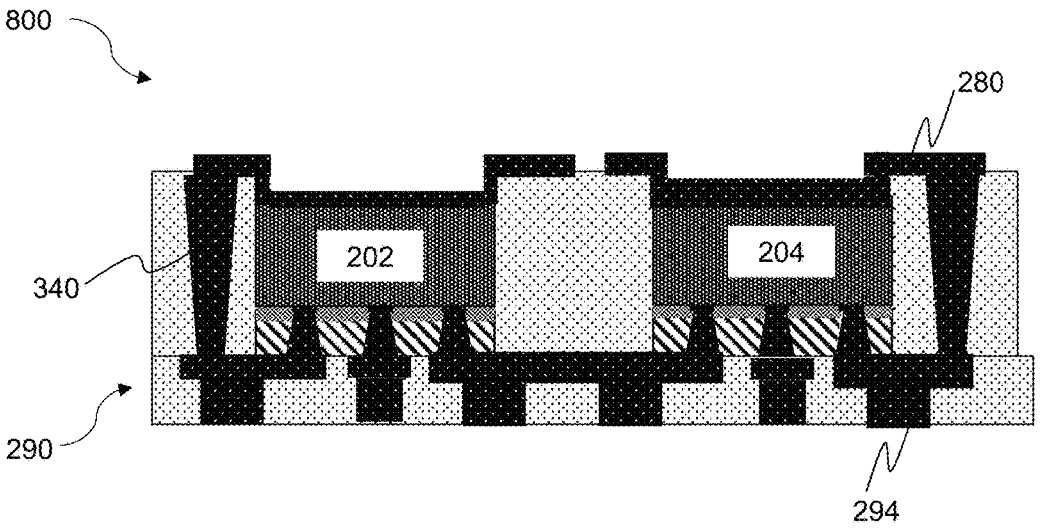
Figure 25B:
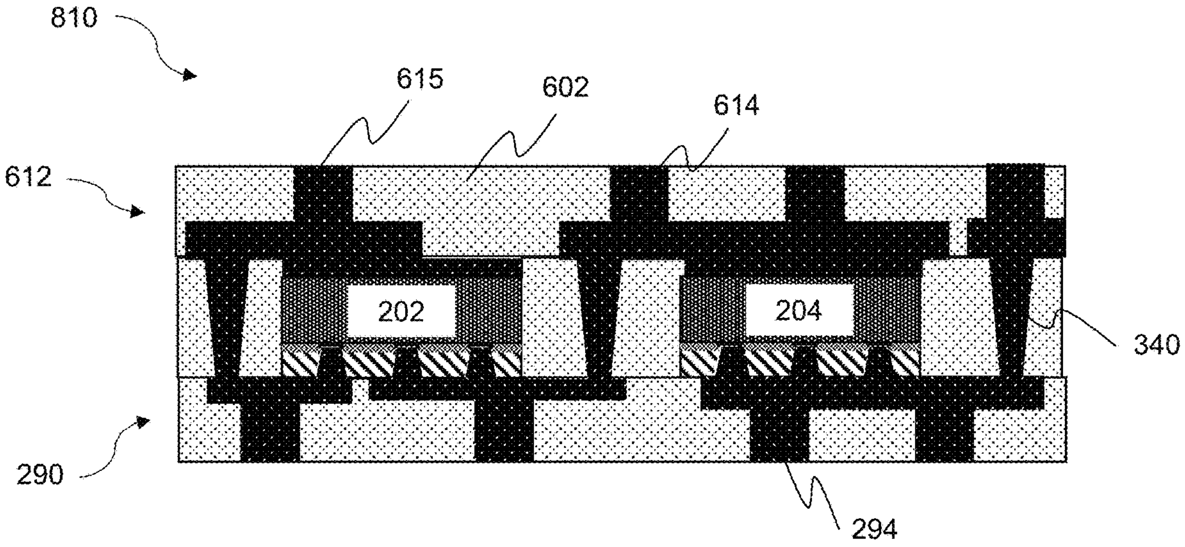

The panel-level semiconductor packaging method 30 may be also used for making a variety of multi-chip modules (MCMs), such as MCM 800, 810. As shown in FIG. 25A and FIG. 25B, the die 200 has the first chip 202 and the second chip 204 for the multi-chip module (MCM) 800, 810. The MCM 800 may have an electrical connection to external components such as PCB via the panel-level studs 294 of the build-up layer 290 from the die active surface 2002, or via the conductive layer 280 from the die back surface 2004, or via both two ways. The MCM 810 has a similar structure except that the stud layer 612 is applied to the conductive layer 280 with the exposed surface 615 of the conductive studs 614 exposed from the passivation layer 602. It is also understood that the multi-chip modules 800, 810 are described herein as embodiments only, and other multi-chip modules can also be made by the panel-level semiconductor packaging method 30 in which the external electrical connections can be achieved from either or both of the die active surface 2002 and the die back surface 2004.

Figure 25C:
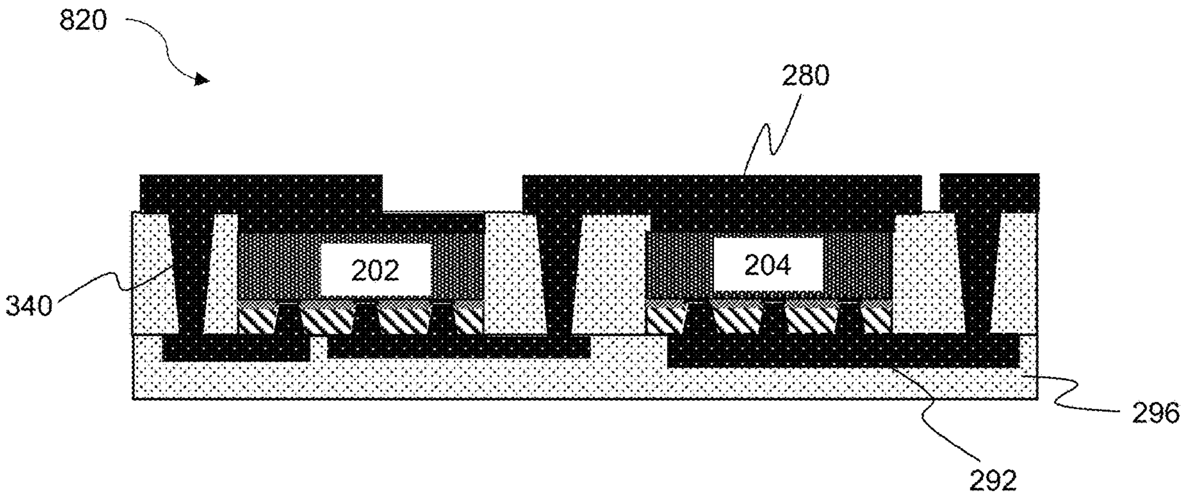
Figure 25D:
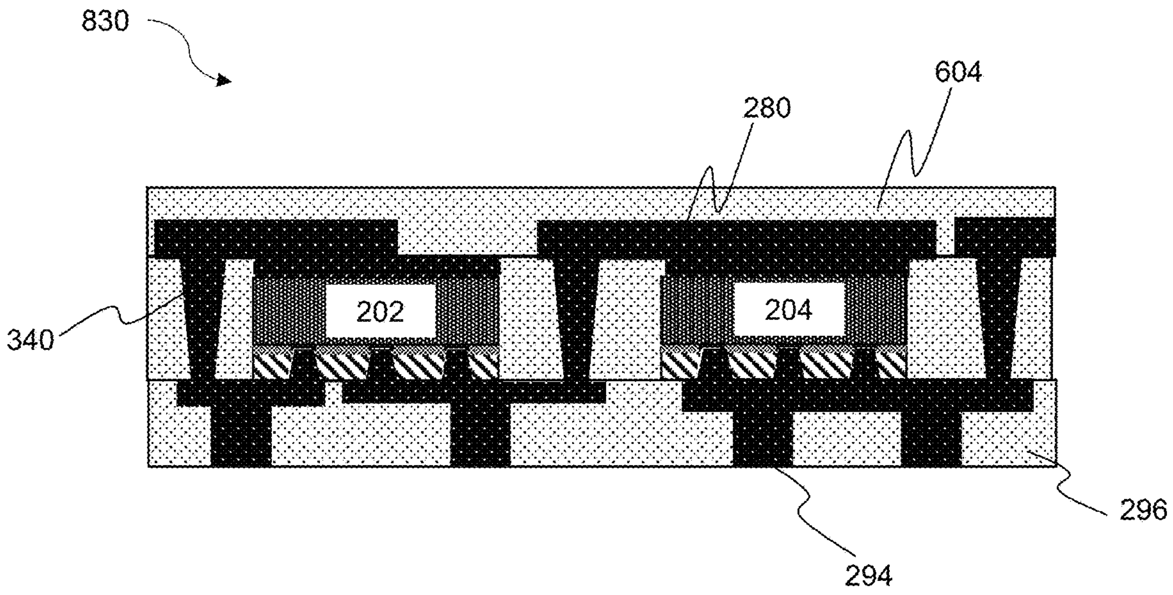

The panel-level semiconductor packaging method 30 may be also used for making multi-chip module (MCM) 820, 830 as embodiments of the present disclosure. As shown in FIG. 25C, the multi-chip module (MCM) 820 may have the external electrical connection only via the conductive layer 280 from the die back surface 2004, since the panel-level trace layer 292 is completely encapsulated within the build-up dielectric layer 296. Alternatively, as shown in FIG. 25D, the multi-chip module (MCM) 830 may have the external electrical connection only via the panel-level studs 294 exposed from the build-up dielectric layer 296, since the conductive layer 280 is completely encapsulated within the back dielectric layer 604 from the die back surface 2004. It is also understood that the multi-chip modules 820, 830 are described herein as embodiments only, and other multi-chip modules can also be made by the panel-level semiconductor packaging method 30 in which external electrical connections can be achieved only from either the die active surface 2002 or the die back surface 2004.

For all the multi-chip modules 800, 810, 820, 830, internal signal communication between the first chip 202 and the second chip 204 may be conducted either in the direct way or in the indirect way as described for the multi-chip modules 650, 660, 670 except that the Copper column 242 is replaced by the filled-through vias 340 as the conducting structure 240 for the indirect way. It is understood that the conducting structure 240 may be in other forms, such as lead frame, molded interconnect substrate (MIS) or any other conductive substrate, and printed circuit board (PCB), all of which fall into the scope of the present disclosure.

In the application, unless specified otherwise, the terms "comprising", "comprise", and grammatical variants thereof, intended to represent "open" or "inclusive" language such that they include recited elements but also permit inclusion of additional, non-explicitly recited elements.

As used herein, the term "about", in the context of concentrations of components of the formulations, typically means +/−5% of the stated value, more typically +/−4% of the stated value, more typically +/−3% of the stated value, more typically, +/−2% of the stated value, even more typically +/−1% of the stated value, and even more typically +/−0.5% of the stated value.

Throughout this disclosure, certain embodiments may be disclosed in a range format. The description in range format is merely for convenience and brevity and should not be construed as an inflexible limitation on the scope of the disclosed ranges. Accordingly, the description of a range should be considered to have specifically disclosed all the possible sub-ranges as well as individual numerical values within that range. For example, description of a range such as from 1 to 6 should be considered to have specifically disclosed sub-ranges such as from 1 to 3, from 1 to 4, from 1 to 5, from 2 to 4, from 2 to 6, from 3 to 6 etc., as well as individual numbers within that range, for example, 1, 2, 3, 4, 5, and 6. This applies regardless of the breadth of the range.

It will be apparent that various other modifications and adaptations of the application will be apparent to the person skilled in the art after reading the foregoing disclosure without departing from the spirit and scope of the application and it is intended that all such modifications and adaptations come within the scope of the appended claims.

What is claimed is:

1. A semiconductor structure, comprising:

at least one die having a die thickness between a die active surface and a die back surface, wherein the die active surface comprises a die pad;

a protective layer formed on the die active surface, wherein pre-vias are formed in the protective layer for exposing the die pad from the pre-vias;

filled vias in the protective layer by filling the pre-vias with a conductive medium, wherein the filled vias are electrically coupled to the die pad;

a molding layer encapsulating the at least one die and the protective layer, wherein the die back surface is exposed from the molding layer, and the molding layer has a molding thickness larger than the die thickness and a thickness of the protective layer combined for forming a cavity contour;

a conductive layer formed conformally to the cavity contour for forming a concave contour of the conductive layer; and a build-up layer formed on the filled vias for being electrically coupled to the die pad.

2. The semiconductor structure of claim 1, wherein the at least one die comprises two or more chips encapsulated within the molding layer for forming a multi-chip module (MCM), wherein the two or more chips are electrically coupled via the build-up layer.

3. The semiconductor structure of claim 2, wherein at least one of the two or more chips of the MCM is completely encapsulated within the molding layer.

4. The semiconductor structure of claim 1, further comprising:

a conducting structure coupled to the build-up layer and the conductive layer from the die active surface and the die back surface, respectively.

5. The semiconductor structure of claim 4, further comprising:

a back dielectric layer encapsulating the conductive layer.

6. The semiconductor structure of claim 4, wherein the conducting structure comprises a Copper column, a lead frame, a molded interconnect substrate (MIS) or any combination thereof.

7. The semiconductor structure of claim 4, wherein the conducting structure comprises filled-through vias.

8. The semiconductor structure of claim 1, further comprising:

a heat sink disposed on the conductive layer, wherein the heat sink has a convex contour complementary to the concave contour of the conductive layer.

9. The semiconductor structure of claim 1, further comprising:

a sacrificial layer formed on the die back surface, wherein the sacrificial layer has a first surface in contact with the die back surface and a second surface co-planar with a top surface of the molding layer.

10. A method of making the semiconductor structure of claim 1, comprising:

providing at least one die having a die active surface and a die back surface and a die thickness therebetween, wherein the die active surface comprises a die pad, and a sacrificial layer is formed on the die back surface and a protective layer is formed on the die active surface, wherein pre-vias are formed in the protective layer for exposing the die pad from the pre-vias and the pre-vias are filled with a conductive medium wherein the filled vias are electrically coupled to the die pad;

forming a molding layer for encapsulating the at least one die, the protective layer and the sacrificial layer;

removing a portion of the molding layer for exposing the sacrificial layer from the molding layer;

removing the sacrificial layer from the die back surface for exposing the die back surface from the molding layer, wherein the molding layer has a molding thickness larger than the die thickness and a thickness of the protective layer combined for forming a cavity contour;

forming a conductive layer conformally to the cavity contour for forming a concave contour of the conductive layer, and forming a build-up layer on the filled vias for being electrically coupled to the die pad.

11. The method of claim 10, further comprising:

forming a conducting structure electrically coupled to the build-up layer and the conductive layer from the die active surface and the die back surface, respectively.

12. The method of claim 11, wherein the conducting structure comprises a Copper column, a lead frame, a molded interconnect substrate (MIS) or any combination thereof, further comprising:

exposing a side surface of the Copper Column, the lead frame, the molded interconnect substrate (MIS) or the combination thereof from the molding layer.

13. The method of claim 12, further comprising:

forming a back dielectric layer encapsulating the conductive layer.

14. The method of claim 10, further comprising:

mounting a heat sink on the conductive layer, wherein the heat sink has a convex contour complementary to the convex contour of the conductive layer.

15. The method of claim 10, wherein the at least one die and the sacrificial layer are provided by:

providing a semiconductor wafer having a wafer active surface and a wafer back surface, wherein the semiconductor wafer comprises a plurality of unsingulated dies;

applying the sacrificial layer on the wafer back surface;

singulating the semiconductor wafer into a plurality of dies with the sacrificial layer on a die back surface of the dies.

16. The method of claim 15, further comprises:

forming the protective layer on the wafer active surface; and forming the pre-vias in the protective layer for exposing die pads on the wafer active surface.

17. The method of claim 16, further comprising:

filling the pre-vias with the conductive medium for forming filled vias electrically coupled to the die pads.

18. The semiconductor structure of claim 1, wherein the cavity contour comprises an interface between a top surface of the molding layer and the die back surface, and the interface further comprises a sharp profile or a sloped profile.

19. The semiconductor structure of claim 1, wherein the cavity contour has a bottom surface for exposing the die back surface, and the bottom surface has an area substantially the same as a size of the die back surface.

* * * * *